US009604254B2

(12) United States Patent
Brubaker

(10) Patent No.: US 9,604,254 B2
(45) Date of Patent: Mar. 28, 2017

(54) PHASE TRACK CONTROLLER IMPROVEMENT TO REDUCE LOSS OF LOCK OCCURRENCE

(71) Applicant: Versatile Power, Inc., Campbell, CA (US)

(72) Inventor: David I. Brubaker, San Carlos, CA (US)

(73) Assignee: Versatile Power, Inc., Campbell, CA (US)

( * ) Notice: Subject to any disclaimer, the term of this patent is extended or adjusted under 35 U.S.C. 154(b) by 471 days.

(21) Appl. No.: 14/325,235

(22) Filed: Jul. 7, 2014

(65) Prior Publication Data

US 2015/0008790 A1 Jan. 8, 2015

Related U.S. Application Data

(60) Provisional application No. 61/843,306, filed on Jul. 5, 2013.

(51) Int. Cl.
*H01L 41/08* (2006.01)
*B06B 1/02* (2006.01)

(52) U.S. Cl.
CPC .................................. *B06B 1/0261* (2013.01)

(58) Field of Classification Search
CPC ....... H02N 2/14; H01L 41/042; H01L 41/044; B06B 1/0255; B06B 2201/55
USPC ............................ 310/316.01, 314, 317, 318
See application file for complete search history.

(56) References Cited

U.S. PATENT DOCUMENTS

| | | | | |
|---|---|---|---|---|
| 6,362,986 | B1 * | 3/2002 | Schultz et al. | 363/132 |
| 8,115,366 | B2 * | 2/2012 | Hoffman et al. | 310/316.01 |

* cited by examiner

*Primary Examiner* — Thomas Dougherty
(74) *Attorney, Agent, or Firm* — Terrence J. Edwards; TechLaw Ventures, PLLC

(57) ABSTRACT

A system and method for driving ultrasonic transducers and improvements to a phase track controller for reducing loss of lock occurrence is disclosed and described.

27 Claims, 20 Drawing Sheets

PHASE TRACK CONTROLLER IMPROVEMENT TO REDUCE LOSS OF LOCK OCCURRENCE

CROSS-REFERENCE TO RELATED APPLICATIONS

This application claims the benefit of U.S. Provisional Patent Application No. 61/843,306, filed on Jul. 5, 2013, which is hereby incorporated by reference herein in its entirety, including but not limited to those portions that specifically appear hereinafter, the incorporation by reference being made with the following exception: In the event that any portion of the above-referenced application is inconsistent with this application, this application supersedes said above-referenced application.

STATEMENT REGARDING FEDERALLY SPONSORED RESEARCH OR DEVELOPMENT

Not applicable.

BACKGROUND

Field of the Disclosure

This disclosure relates generally to ultrasonic transducers, and more particularly, to a system and method for driving ultrasonic transducers and improvements to a phase track controller for reducing loss of lock occurrence.

Background of the Disclosure

Ultrasonic transducers have been in use for many years. Current technology typically depends on resonant circuits to drive ultrasonic transducers. Resonant circuits are, by definition, designed to operate in a very narrow range of frequencies. Because of that, the transducer tolerances are held very tightly to be able to operate with the driving circuitry which results in higher costing circuits. In addition, there is no possibility of using the same driving circuit for transducers with different frequencies because of the static nature of typical drivers, and the circuit must be changed for every transducer frequency. There is also a need for a system and method for driving any transducer regardless of the resonant frequency of the transducer.

U.S. Pat. No. 8,115,366 B2 describes a linear phase track controller which can accurately generate a wide range of frequencies and is capable of individually driving multiple transducers with different resonant frequencies.

A disadvantage of a linear phase track controller occurs when it is no longer able to track the output phase, due to noise or some other perturbation in the system. This condition is called loss of lock. This disclosure describes an enhancement to a linear phase track controller which greatly reduces loss of lock occurrences.

The features and advantages of the disclosure will be set forth in the description which follows, and in part will be apparent from the description, or may be learned by the practice of the disclosure without undue experimentation. The features and advantages of the disclosure may be realized and obtained by means of the instruments and combinations particularly pointed out herein.

SUMMARY

Briefly and in general terms, the disclosure is directed to improvements to a linear phase track controller used to drive an ultrasonic transducer for reducing loss of lock occurrence.

The disclosure will describe an implementation of methods and systems to drive ultrasonic transducers. It will be appreciated that a method is often required to generate a wide range of frequencies with high accuracy and very high frequency shifting speed. Such a system and method may individually drive multiple transducers each having a different frequency, thereby allowing device manufacturers to take advantage of economies of scale by implementing the same driver with various transducers having different frequencies.

In aspects of the disclosure, a system may comprise a controller adapted to provide a voltage and a frequency, the controller may be configured to vary the voltage based on a current error signal derived from a drive current through a transducer and from a current command, the controller may be configured to vary the frequency based on at least one parameter indicative of whether the transducer is at or near a resonance state. The system may also comprise a drive adapted to receive the voltage and the frequency from the controller, and may be adapted to provide a drive voltage at a drive frequency to the transducer based on the voltage and the frequency received from the controller, the drive voltage being at a level that maintains the drive current at substantially the current command, the drive frequency being at substantially a resonant frequency of the transducer. In further aspects of the disclosure, the at least one parameter includes a phase angle between the drive current and the drive voltage.

In aspects of the disclosure, a method may comprise providing a drive voltage at a drive frequency to a transducer, the drive voltage causing a drive current through the transducer. The method may further comprise sensing the drive current and determining a current error from the sensed drive current and from a current command. The method may further comprise adjusting the drive voltage based on the current error, and determining at least one parameter from the sensed drive current and from the voltage level, the at least one parameter indicative of whether the transducer is at or near a resonance state, the at least one parameter including a phase angle between the drive current and the drive voltage. The method may further comprise adjusting the drive frequency based on the at least one parameter, including maintaining the drive frequency at or substantially at a resonant frequency of the transducer.

The "measured phase" of a system may be defined as the phase angle between the transducer voltage and transducer current. The "commanded phase" of the system is the phase angle at which a user wants the transducer to be driven. A linear phase track controller operates by adjusting the drive frequency to drive the difference between the measured phase and a commanded phase (this difference is called the "phase error") to zero. In implementations of the disclosure, a commanded phase, selected to be well below the anticipated minimum peak phase and to be near the resonant frequency of the transducer, is specified. The measured phase of the system, defined as the phase angle between the transducer voltage and transducer current, is fed back and instantaneously subtracted from the commanded phase to form the phase error. In response to a positive phase error (the actual phase is less than the commanded phase), the phase track controller generates a positive frequency step ($\Delta$Frequency), increasing the drive frequency and thereby decreasing the phase error. Similarly, in response to a negative phase error (the actual phase is greater than the commanded phase), the phase track controller generates a negative $\Delta$Frequency, decreasing the drive frequency and thereby again decreasing the phase error.

When the phase error is at or near zero, the linear phase track controller is correctly driving the transducer. If the phase error becomes too great, phase tracking may be lost. Loss of phase tracking (also called loss of lock) can occur when the controller is used in systems with significant phase noise. In addition, as the physical load on the transducer changes, the phase response (and the admittance response also) can shift in frequency, become wider or narrower, and/or can have a greater or lesser peak value. If this physical load change occurs rapidly with respect to the system sampling interval, measured phase can transition to the high frequency (or anti-resonance) side of the transducer phase curve, also ultimately resulting in loss of phase lock.

In aspects of the disclosure, the phase response curve with phase operating regions may be defined. As long as the sensed phase remains within the phase band (i.e., near the operating point), the linear phase track controller executes. However, if phase is sensed to be outside the phase band, conditionally, linear phase track control may be suspended and, one of two nonlinear mechanisms may be executed to drive the phase back into the phase band.

In aspects of the disclosure, the frequency source select module determines the source of the frequency step, ΔFrequency, applied to the frequency generator, switching among the original phase track controller and the "up search" and "down search" generators. When the sensed phase is within the specified phase band, the phase track controller generates ΔFrequency. If the sensed phase is greater than the upper edge of the phase band and the frequency is increasing, the down search generator is activated. The down search generator generates a pre-defined number of negative ΔFrequency steps, while also looking for a maximum admittance (or, alternatively, a minimum phase error). After completion of the pre-defined number of steps, the frequency is set to the frequency of the sensed maximum admittance (or the frequency of the minimum phase error) and the phase track controller re-enabled as the source of the frequency stepping.

Similarly, if the sensed phase is less than the lower edge of the phase band and the frequency is decreasing, the up search generator is activated. The up search generator generates a pre-defined number of positive ΔFrequency steps, while also looking for a maximum admittance (or, alternatively, a minimum phase error). After completion of the pre-defined number of steps, the frequency is set to the frequency of the sensed maximum admittance (or the frequency of the minimum phase error) and the phase track controller re-enabled as the source of the frequency stepping.

In aspects of the disclosure, various implementations of the up search and down search generators and the frequency source select components may be utilized. This logic is executed periodically, nominally at between 1 and 100 millisecond intervals, depending on the ultrasonic transducer characteristics.

The features and advantages of the disclosure will be more readily understood from the following detailed description, which should be read in conjunction with the accompanying drawings.

BRIEF DESCRIPTION OF THE DRAWINGS

Non-limiting and non-exhaustive implementations of the disclosure are described with reference to the following figures, wherein like reference numerals refer to like parts throughout the various views unless otherwise specified. Advantages of the disclosure will become better understood with regard to the following description and accompanying drawings where.

DETAILED DESCRIPTION

Figure 1:
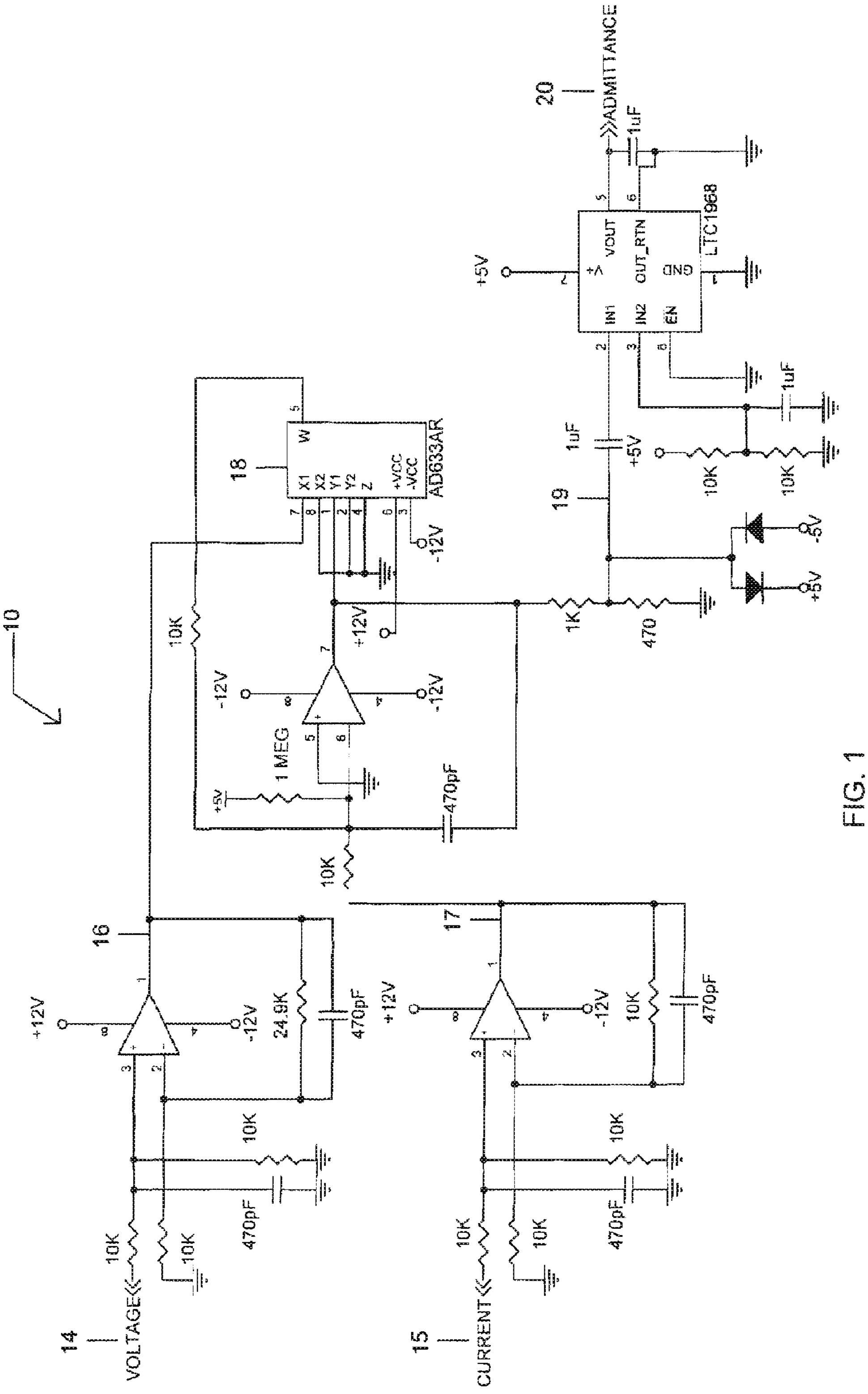
FIG. 1 is a schematic diagram showing a circuit configured to determine admittance in accordance with the principles and teachings of the disclosure.

In the following description of the disclosure, reference is made to the accompanying drawings, which form a part hereof, and in which is shown by way of illustration specific implementations in which the disclosure may be practiced. It is understood that other implementations may be utilized and structural changes may be made without departing from the scope of the disclosure.

Some embodiments of the disclosure may involve hardware and software. The hardware may include a switching amplifier to create a sine wave output to an ultrasonic transducer. The ultrasonic transducer can or may be a piezoelectric transducer. The switching amplifier can be run with high efficiency over a broad range of frequencies and can, therefore, be used to drive transducers of many frequencies. The switching amplifier can also drive transducers that do not have tightly held frequency tolerances thereby reducing transducer production cost. This allows for reduction of production cost due to economies of scale and allows for customers that use different frequency transducers to always be able to use the same driver.

Previous ultrasonic generators have relied on resonant power sources or analog amplifiers to drive the transducer. In some embodiments of the disclosure, a class D or class E amplifier may be used to amplify the output of a digitally controlled AC source. This technique frees the manufacturer and user from the requirement of designing a resonant system around a specific transducer. Instead, this system is usable for any transducer over a broad range of frequencies.

Previous class D and class E amplifiers have used traditional LC or cascaded LC filters to significantly reduce the effects of the class D or E carrier frequency on the signal frequency. In some embodiments of the disclosure, a two phase output signal may be used in conjunction with a coupled transformer to reduce the effect of the carrier frequency to several times lower than could be done with similar size and cost components with the traditional LC type filters.

In some embodiments of the disclosure, software could run entirely on low cost, 16-bit, integer-only microcontrollers. The more powerful DSP (digital signal processor) modules typically required in the field are not required in the disclosure, although DSP modules could be used in some embodiments.

A method may be required to generate a wide range of frequencies with high accuracy and very high frequency shifting speed. A digital synthesizer could be used in an ultrasonic system to allow rapid and flexible frequency control for output of a frequency generator.

In some embodiments, dead time may be minimized in switching circuits in order to minimize the output impedance to the transducer. As used herein, the phrase "dead time" is the time in power switching circuits when all switching elements are off to prevent cross conduction. A minimum or maximum admittance may be used when determining the resonant frequency. The admittance measured will vary much less between in resonance and out of resonance in a low Q system than in a high Q system. The dimensionless parameter "Q" refers to what is commonly referred to in engineering as the "Q factor" or "quality factor." Because Q is directly affected by the impedance of the driving circuit, this impedance must be kept very low. In addition to the commonly considered impedances of the output transformer, driving semiconductors, PCB (printed circuit board) and other directly measureable impedances, Applicants have found that the dead time has a very strong effect on the output impedance of the driver. As such, the switching circuit may be configured to have a very small (approximately 50 nanoseconds) dead time. In some embodiments, the switching circuit may have a dead time that may be greater than or less than 50 nanoseconds.

For optimum operation, the transducer may be run at or near its resonant frequency point. The resonant frequency point of the transducer is defined as the frequency at which maximum real power is transferred from the drive amplifier to the transducer.

Applicants have found that the admittance of the transducer provides a reliable indication of the proximity of the transducer to its resonant frequency point. Admittance is defined as the RMS (root-mean-square) amplitude of the transducer drive current divided by the RSM amplitude of the transducer drive voltage.

The circuit 10 shown in FIG. 1 determines the RMS (root mean square) value of the admittance 12 of a driven transducer in real time. The RMS value of the admittance may be used for analysis by software contained and run by the hardware. The RMS value of the admittance 12 may be obtained from the RMS voltage 14 across the transducer and RMS current 16 supplied to the transducer.

The circuit in FIG. 1 is an example of a circuit that measures the real-time admittance of the load. RMS voltage 14 and RMS Current 15 are filtered. The filtered signals for voltage 16 and current 17 may be fed into an analog divider 18 and the resultant output 19 may be fed to an RMS converter. The final output 20 is RMS admittance. This is a known means to measure admittance.

Applicants have also found that the phase of the transducer also provides a reliable indication of the proximity of the transducer to its resonant frequency point. Phase is defined as the phase angle between the transducer drive voltage and transducer drive current.

Figure 2:
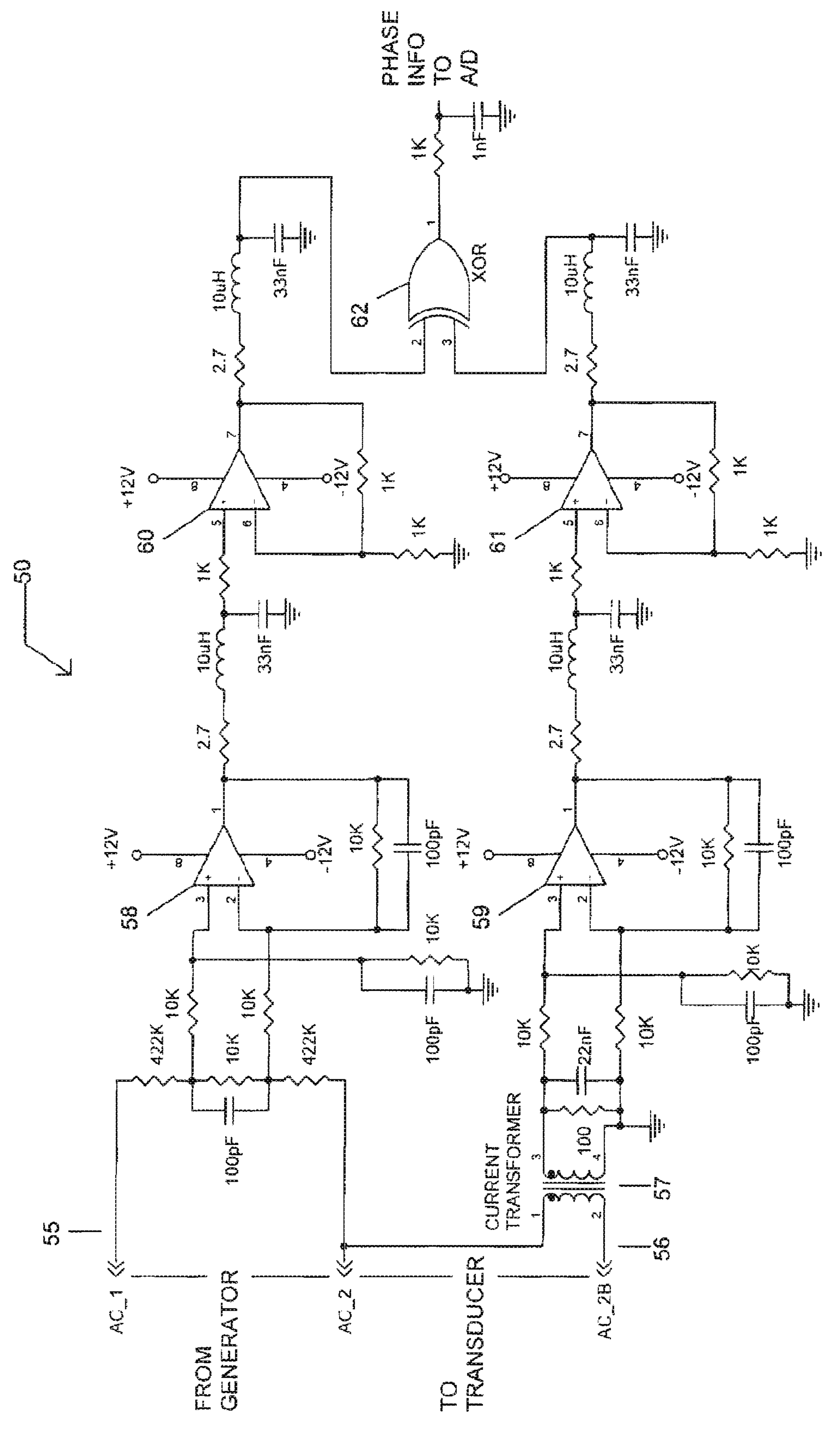
FIG. 2 is a schematic diagram showing a circuit having an exclusive OR gate, the circuit configured to determine a phase angle in accordance with the principles and teachings of the disclosure.
Figure 2A:
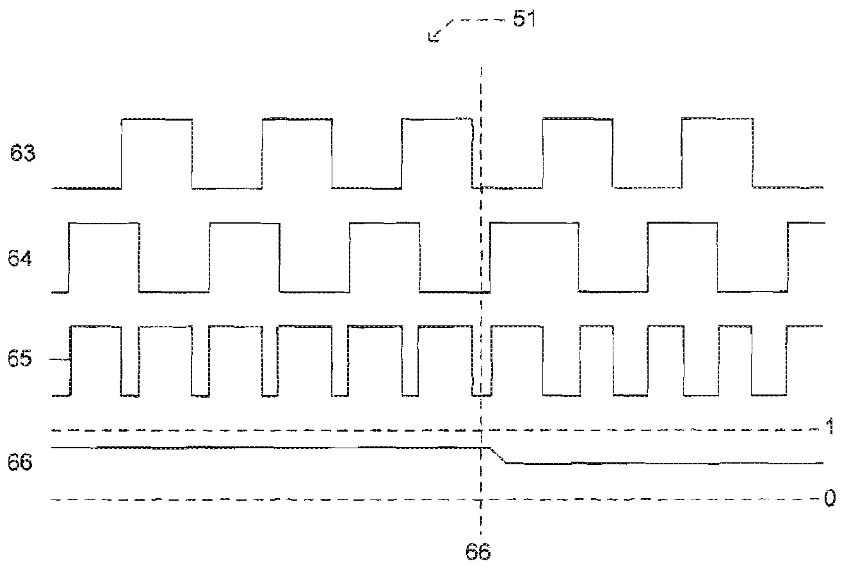
FIG. 2*a* is a flow diagram showing waveforms into and out of an exclusive OR gate of the circuit of FIG. 2.

The circuit shown in FIG. 2 is an example of a circuit that derives the phase relationship of two input signals. The voltage driving signal from the generator 55 may be buffered and filtered by amplifier 57. The current of the generator signal may be found by passing the generator output through current transformer 57 and then buffering and filtering this signal through amplifier 59. Each output (current and voltage) is put into a comparator. The output of the comparator will be high when the respective signal is above zero volts and will be low when it is below zero volts. The output of the comparators, therefore, transition when the input signal crosses zero. If the point where each signal crosses zero is compared an indication of the phase relationship will be known. To find this phase relationship and convert it into an analog voltage, an exclusive OR gate 62 may be used and its output may be passed through a simple RC filter. The waveforms into and out of the exclusive OR gate are shown in FIG. 2*a*. In this example, signal 63 represents the output of the comparator for the voltage and signal 64 represents the output of the comparator for the current signal. The reader can observe that the two signals are out of phase and that the phase relationship changes at time 66. Persons skilled in the art will recognize that the output of an exclusive OR gate will be high when the input signals are different and low when they are the same. Signal 65, therefore, shows the output of the exclusive OR gate. The RC filter effectively integrates the waveform 65 resulting in signal 67. As can be seen, the result is an analog voltage 67 that is proportional to the phase relationship of the two input waveforms, 63, 64. This analog signal 67 may then be input to the processor.

Figure 3:
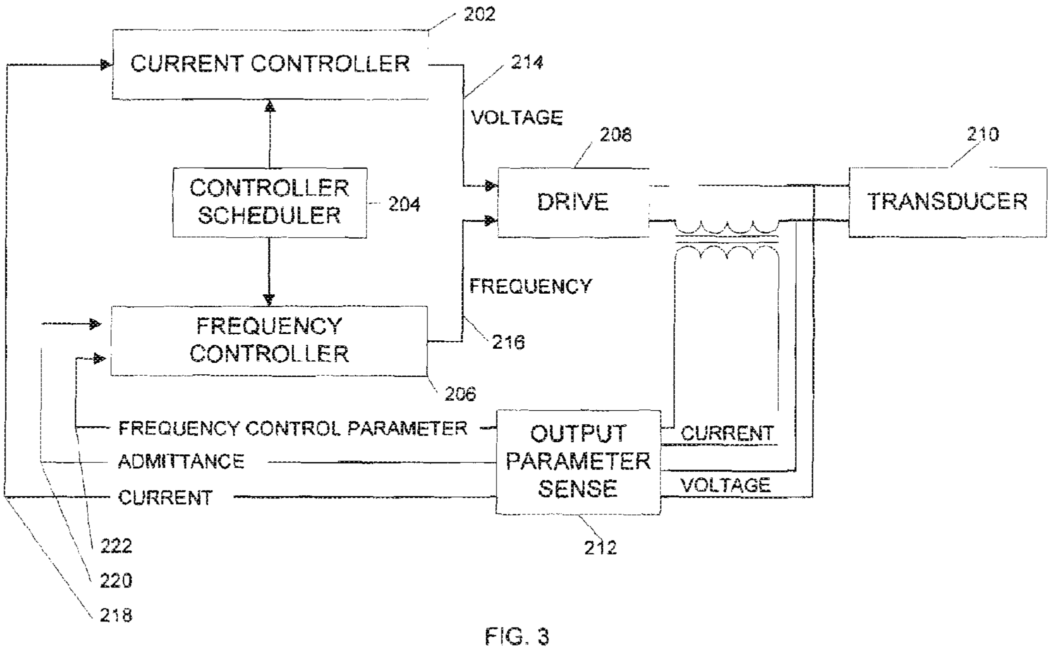
FIG. 3 is a block diagram showing a system for driving a transducer in accordance with the principles and teachings of the disclosure.

FIG. 3 depicts a system and method of driving an ultrasonic transducer. The method may be implemented by hardware and software combined to provide adaptive feedback control to maintain optimum conversion of electrical energy provided to the transducer to motion of transducer elements.

As shown in FIG. 3, the system 200 may include two controllers: a current controller 202 that maintains a constant commanded transducer current; and a frequency controller 206 that searches for and tracks the operating frequency. A controller scheduler 204 interleaves the operation of the two controllers 202, 206 to reduce the operation of one controller adversely affecting the operation of the other controller.

The drive 208 may provide a drive signal of controlled voltage and controlled frequency to the transducer 210. An output parameter sense circuit 212 senses transducer drive voltage and transducer drive current and generates a measure of current 218, admittance 220, and a frequency control parameter 222. The frequency control parameter may be different in different embodiments.

Current 218 is applied as an input to the current controller 202, which may generate a voltage 214 applied to the drive 208. The current controller 202 may set the voltage 214 to maintain the current required for correct operation of the transducer 210 in its given application.

The frequency controller 206 may perform two functions: frequency scanning and frequency tracking. The frequency scanning function searches for a frequency that is at or near the resonant frequency of the transducer. The frequency tracking function maintains the operating frequency at or near the resonant frequency of the transducer.

When the frequency controller 206 is frequency scanning, admittance 220 is applied to it as an input. The frequency controller sweeps the drive frequency over a range of frequencies appropriate for the transducer and application, searching for the resonant frequency.

When the frequency controller 206 is frequency tracking, a frequency control parameter 222 is applied to it as an input. The frequency controller sets the frequency required for correct operation of the transducer in its given applications.

When the frequency controller 206 performs either frequency scanning or frequency tracking, it applies the calculated frequency 216 to the drive 208.

The drive 208 may include the switching amplifier and switching circuits described above. The frequency controller 206 may include the digital synthesizer described above.

As previously mentioned, the Linear Phase Track Controller frequency controller 206 may perform two functions: frequency scanning and performs phase frequency tracking.

In an implementation, initial application of drive to the transducer at its resonant frequency may be highly desirable. Due to variations in transducer characteristics, applied power levels, and the mechanical load the transducer connects to, the resonant frequency may not be known and the frequency controller may perform a frequency scan to establish the drive frequency at or near the resonant frequency for the transducer.

Figure 4:
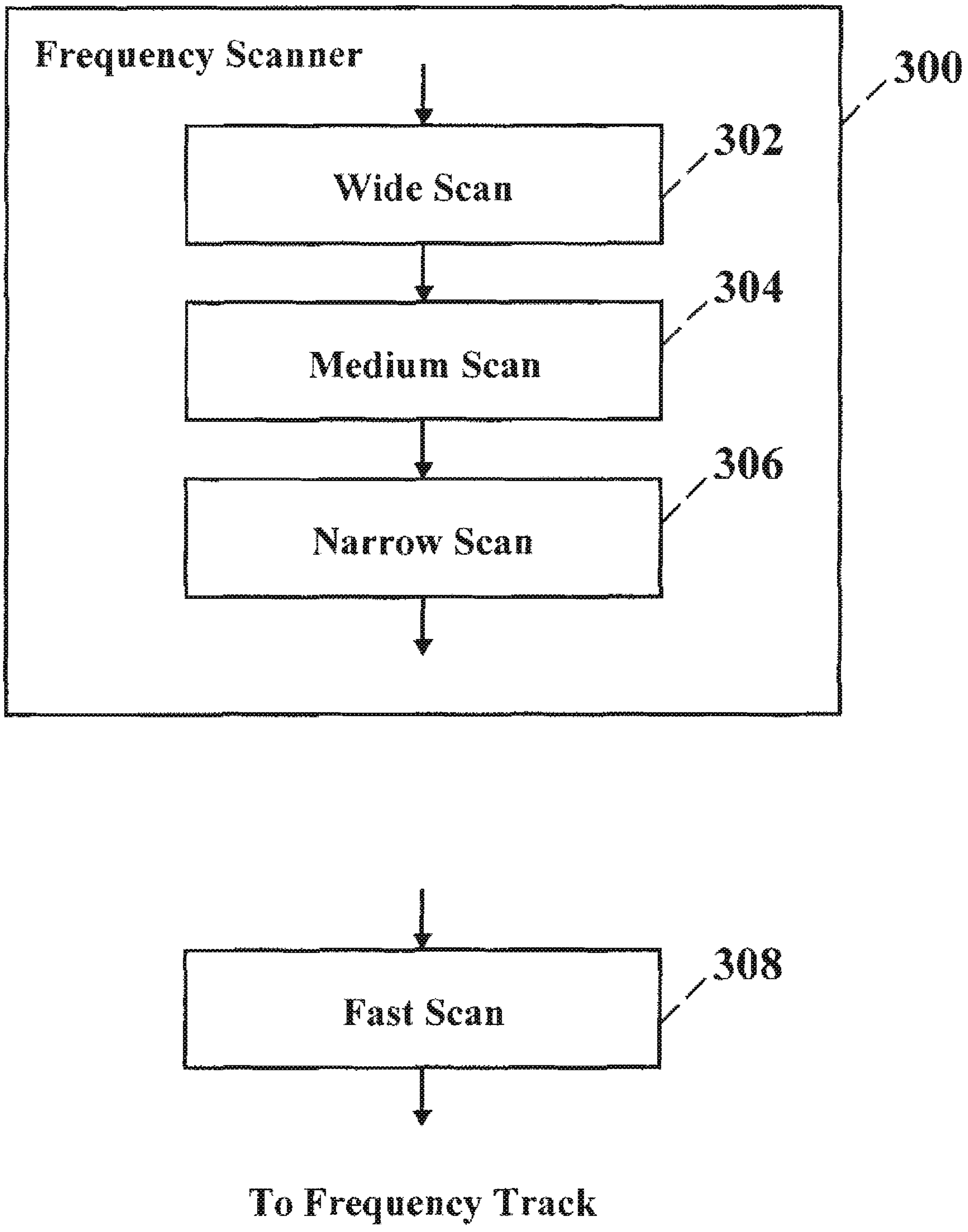
FIG. 4 is a flow diagram showing elements of a frequency controller in accordance with the principles and teachings of the disclosure.

When performing a frequency scan, the frequency controller searches a predefined range of frequencies for the frequency at which the transducer admittance is maximum. As shown in FIG. 4, the frequency scanner 300 is made up of three sweep scans: a wide scan 302, which is followed immediately by a medium scan 304, which is followed immediately by a narrow scan 306. The wide scan includes a .+-.1 kHz sweep about a predefined frequency, in 4 Hz steps, with a 10 msec settling time after each step, and detecting the admittance after each settling time. The medium scan includes a .+-.100 Hz sweep about the frequency of maximum admittance detected by the wide scan, in 2 Hz steps, with a 25 msec settling time after each step, and detecting the admittance after each settling time. The narrow scan includes a .+-.10 Hz sweep about the frequency of maximum admittance detected by the medium scan, in 1 Hz steps, with a 50 msec settling time after each step.

In some embodiments, admittance may be detected after each narrow scan settling time and, at completion of the narrow scan, the drive frequency is set to the frequency of maximum detected admittance.

In some embodiments, phase is detected after each narrow scan settling time and, at completion of the narrow scan, the drive frequency is set to the frequency with detected phase closest to the phase required for correct operation of the transducer in its given application.

An ultrasonic transducer may often have multiple frequencies at which the commanded phase is measured. The frequency of maximum admittance will always be at or close to the resonant frequency, the frequency of maximum real power transfer. For this reason, maximum admittance may be used for wide and medium scans for the operating point, regardless of the method used in the narrow scan.

In an implementation, the frequency scanner 300 can be executed at either full power (as defined by the user) or at a predefined low power of less than 5 watts, measured at transducer resonance.

The frequency controller 206 may optionally perform a fast scan 308 as part of its operation, immediately prior to initiation of a frequency track algorithm. The fast scan includes a .+-.10 Hz sweep about the current frequency, in 2 Hz steps, with a 10 msec settling time after each step.

In some embodiments, admittance is detected after each fast scan settling time and, at completion of the fast scan, the drive frequency is set to the frequency of maximum detected admittance.

In some embodiments, phase may be detected after each fast scan settling time and, at completion of the fast scan, the drive frequency is set to the frequency with detected phase closest to the phase required for correct operation of the transducer in its given application. The fast scan 308 can be executed at either full power or at less than 5 watts power.

The transducer resonant frequency may fluctuate during normal operation. This fluctuation may occur due to changes in operating conditions of the transducer, such as changes in temperature of the transducer and mechanical load on the transducer. Phase tracking may be performed to compensate for this fluctuation in resonant frequency.

Figure 5:
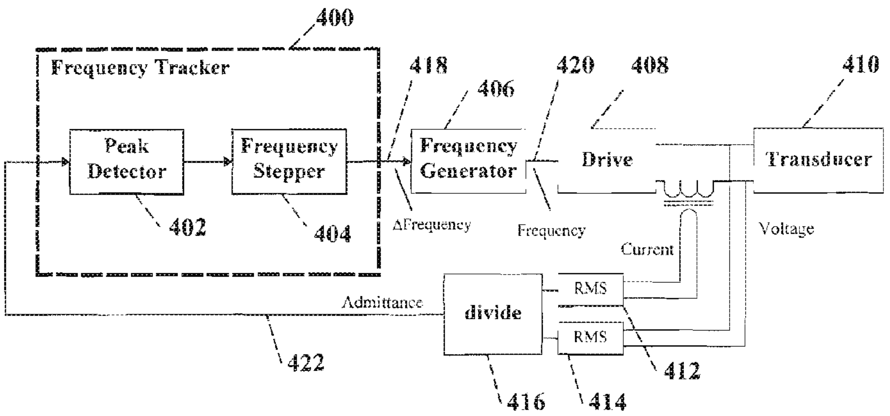
FIG. 5 is a block diagram showing a frequency tracker utilizing admittance in accordance with the principles and teachings of the disclosure.

FIG. 5 shows an embodiment of a frequency tracker. The frequency tracker 400 may comprise two components: a peak detector 402 and a frequency stepper 404. The peak detector samples the transducer admittance 422. The peak detector then commands the frequency stepper 404 to take a random-size step, between 1 and 10 Hz in a random direction, either up or down. The frequency stepper calculates the random step size and direction and sends the frequency step, Δfrequency 418, to the frequency generator 406 which generates the new drive frequency 420 and applies it to the drive 408 (208 in FIG. 3). The frequency tracker delays a short time period based on the size of the frequency step (nominally 10 to 50 msecs) to allow the transducer to settle on the newly commanded frequency. Transducer 410 drive current and transducer drive voltage are continually monitored and converted to their RMS equivalent values by RMS converters 412 and 414, respectively. The divider 416 divides RMS current by RMS voltage to calculate admittance 422 which is applied to the peak detector 402. With this admittance, the peak detector calculates the change in detected admittance that resulted from the step in frequency.

If the detected admittance has increased by greater than a predefined amount, the next step 418 is taken in the same direction as the previous step, with step size based on the magnitude of the increase in admittance. For example, the magnitude of the step can be proportional to the detected increase in admittance. If the detected admittance has decreased by greater than a predefined amount, the next step 418 is taken in the opposite direction, with the magnitude of the step being based on the magnitude of the increase in admittance. If the detected admittance has neither increased by greater than a predefined amount nor decreased by greater than a predefined amount, the admittance is assumed to be at its peak and a zero magnitude "step" is taken. The frequency tracker delays a short time period to allow the transducer to settle and the peak detection and step sequence is repeated.

The maximum admittance of a transducer may increase, remain unchanged, or decrease, depending on changes in operating conditions of the transducer. Frequency tracking for increasing and unchanging maximum admittance values is performed by the above-described frequency tracking method. Tracking the resonant frequency associated with a decreasing admittance maximum is performed by stepping quickly in equal magnitude steps in both directions about the current frequency until the decrease in admittance stops and increased admittance values are again detected. The Frequency Controller then changes the frequency to again lock on the point of maximum admittance.

The frequency tracking method described above can be implemented with an algorithm within software being run by the hardware of the system 200.

Figure 6:
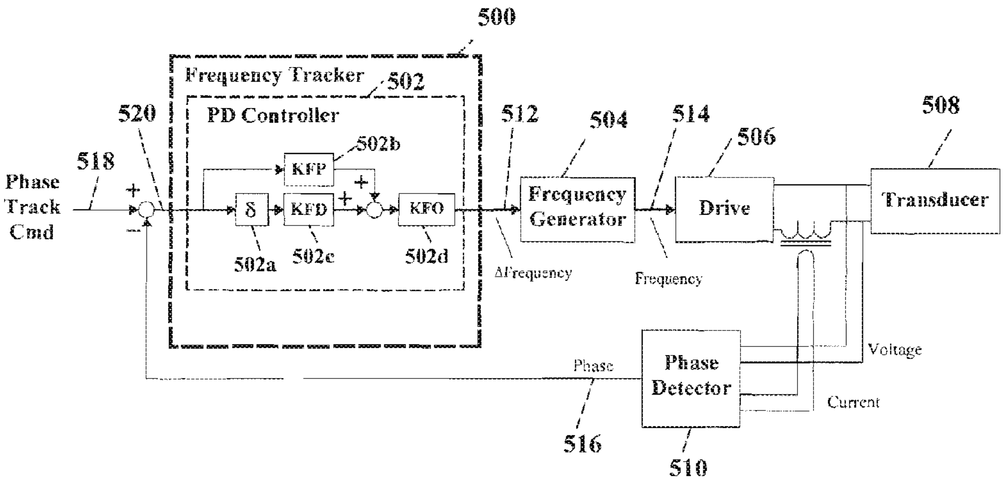
FIG. 6 is a block diagram showing a frequency tracker applying phase error to a PD controller in accordance with the principles and teachings of the disclosure.

Another embodiment of the frequency tracker, shown in FIG. 6, uses the phase angle 516 between the transducer drive voltage and the transducer drive current to maintain the resonant frequency. For some ultrasonic transducer, the resonant frequency occurs at zero phase. For some transducers, and related to the transducer operating conditions, the resonant frequency occurs with a negative phase value. Commanded phase 518 is empirically selected for a given transducer with given set of operating conditions.

The frequency tracker 500 performs frequency tracking by applying a phase angle error term 520 to a Proportional-Derivative (PD) controller 502 at regular sampling intervals of between 5 and 20 msecs. The phase angle error term is calculated to be the difference between the phase track command 518 and the measured transducer phase 516. The PD controller 502 includes a differentiator, Δ 502*a*, a proportional gain, KFP 502*b*, a differential gain, KFD 502*c*, and an output gain, KFO 502*d*. The output from the PD controller 502 in response to a phase error 520 is a step in frequency, A frequency 512, of magnitude and sign necessary to drive the phase error 520 toward zero. The step in frequency 512 is applied to the frequency generator 504 which calculates the new frequency 514. The driver drives the transducer 508 at the frequency 514 from the frequency generator 504.

Figure 7:
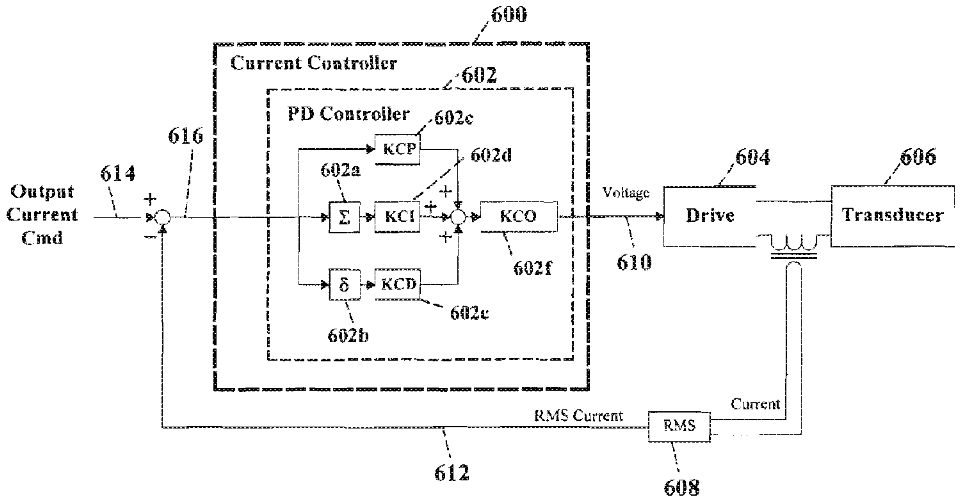
FIG. 7 is a block diagram showing a current controller applying current error to a PID controller in accordance with the principles and teachings of the disclosure.

FIG. 7 shows an embodiment of the current controller 202 in FIG. 3. The current controller 600 maintains current through the transducer at a constant, user-commanded level 614. The user commanded level 614 may correspond to a desired level of operation of a device containing a transducer. For example, the user commanded level may correspond to a desired energy level of a surgical cutting device containing a piezoelectric transducer.

The current controller 600 varies the current through the transducer by varying the drive voltage applied across the transducer. Increasing the drive voltage increases the transducer current and decreasing the drive voltage decreases the transducer current. In some embodiments, the current controller 600 provides a voltage 610 to the drive 604, and this voltage is provided by the drive 604 to the transducer 606.

At a regular sampling intervals, ranging between 5 and 20 msecs, the current controller 600 samples the transducer current and converts it to an RMS current value 612 by an RMS converter 608. At each sampling interval the current controller 600 calculates a current error term 616 by subtracting the sample of the output RMS current 612 from the commanded current 614.

The current controller 600 applies a current error term 616 to a Proportional-Integral-Derivative (PID) controller 602, which generates a response 610 to the error 616. The error 616 is integrated by an integrator 602*a* and differentiated by a differentiator 602*b*. The error 616 and its integral and differential are multiplied respectively by the P, I, and D gains, 602*c*, 602*d*, 602*e* internal to the PID controller, summed, and their sum multiplied by the controller output impedance factor KCO 602*f* to form the controller output voltage 610. Controller gains, 602*c*, 602*d*, 602*e*, 602*f* are set to achieve maximum rise time with an approximately 10% overshoot in the output response to a step in the input. The output impedance factor 602*f* provides both scaling and translation from current to voltage. The controller output voltage 610 is applied to driver 604 to be amplified to become the transducer drive voltage.

In some embodiments, the current controller 600 employs two output impedance factors 602*f*. A larger output impedance factor may be used for the first period of time (nominally 500 msecs) to assure the transducer reaches its steady-state behavior at the given drive power, physical load, and temperature as rapidly as possible. A smaller output impedance factor may be used once the transducer has reached its steady-state behavior. When the switch from the first to the second output impedance factor occurs, the integral of the current error maintained by the PID controller is modified to prohibit an undesired transient in the transducer drive voltage.

In FIG. 3, when the frequency controller 206 sets a drive frequency that results in a change in the frequency control parameter 222, because the transducer current will also change, the current controller 202 will attempt to counter this change. If the frequency controller and the current controller are allowed to operate concurrently, the operation of the frequency controller and the current controller may be in conflict. If the effect of the frequency controller 206 is stronger, frequency tracking will take precedence over a constant output current, and the output current may wander from the commanded value. Conversely, if the effect of the current controller 206 is stronger, a constant output current will take precedence over frequency tracking, and the drive frequency may wander from the transducer resonant frequency.

To achieve balanced operation, the controller scheduler 204 interleaves the operation of the frequency controller 206 and the current controller 202.

When the frequency controller is performing a scan or search operation, the controller scheduler disables the current controller.

When the frequency controller is tracking frequency, in some embodiments the controller scheduler alternates the operation of the two controllers. That is, a controller will execute every 5N msecs, with the current controller executing for odd N and the frequency controller executing for even N.

In some embodiments, both controllers are allowed to operate simultaneously, except immediately after a frequency step. When the frequency controller is tracking frequency, the controller scheduler disables the current controller for the first M 5-msec periods after a frequency step. The number of periods, M, is typically 2, but can be more or less than 2. At the end of the M periods, the frequency control parameter is now only a result of the step in frequency and not of control exerted by the current controller. The frequency control parameter is sampled at this time and stored for the next frequency controller calculation, and the controller scheduler re-enables the current controller.

Figure 8:
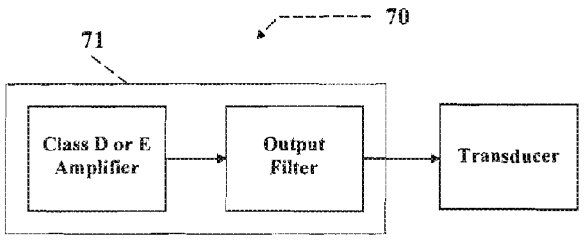
FIG. 8 is a block diagram showing an output filter for filtering a drive signal to a transducer in accordance with the principles and teachings of the disclosure.

The output of the processor running the code discussed previously is a small signal with all the characteristics of necessary to drive and ultrasonic transducer except for the amplitude. The drive circuit 208, 408, 506 can be broken down into two sections as shown in FIG. 8. In FIG. 8 the drive section 71 comprises an amplifier of Class D or E and an output filter.

Prior art has used linear amplifiers for this drive section. These have the disadvantages of being large, inefficient and costly. The illustrated embodiment of FIG. 8 uses a switching amplifier which in some cases can be of Class D or E. Use of switching amplifiers is common in audio applications, but new to the field of ultrasonics.

In some embodiments, the drive 208, 408, 506 includes filter circuitry. In some embodiments with a transducer operational range of 20 kHz to 60 kHz, the filter circuitry may be configured to have a corner frequency higher than 60 kHz to avoid excessive resonant peaking depending on the type of transducer and its intended use, it will be appreciated that the transducer operational range can be lower than 20 kHz and/or higher than 60 kHz, and the filter circuitry can be configured to have a corner frequency higher than the transducer operational range. The carrier frequency used may be about 10 times that of the transducer resonance frequency in some implementations.

In some embodiments the filter circuitry is configured to reduce transmission of the carrier frequency (Fs) from a switching amplifier of the drive 208, 408, 506. Non-limiting examples of filter circuitry are described below.

Figure 9:
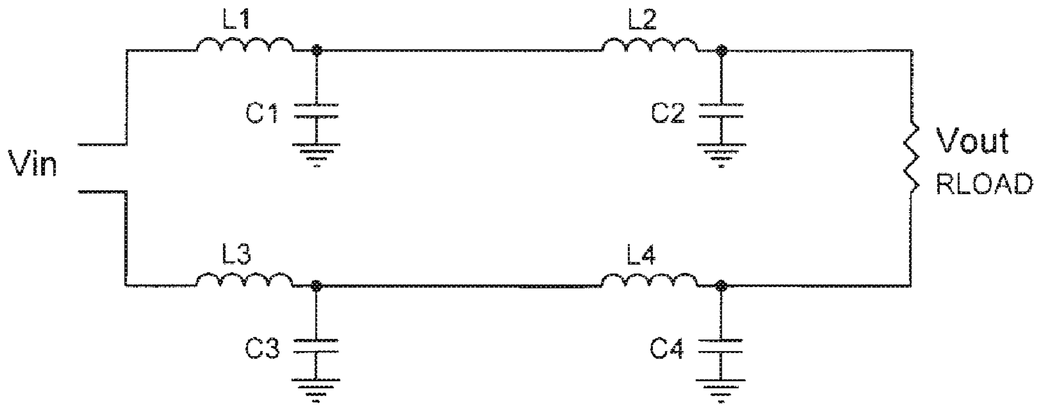
FIG. 9 is a schematic diagram showing an output filter comprising a cascaded LC filter.

In previous art, the output filter of a switching amplifier is typically implemented with an LC or cascaded LC filter. An example of a cascaded LC filter is shown in FIG. 9. FIG. 9 shows the required elements (L1, C1, L2, C2, L3, C3, L4, C4) and the load (RLOAD).

Figure 10:
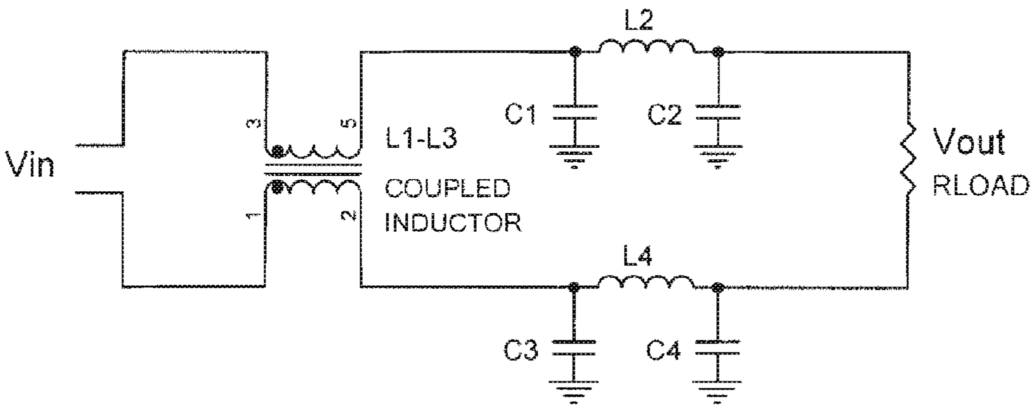
FIG. 10 is a schematic diagram showing an output filter comprising a coupled LCLC filter having magnetically coupled inductors.

Part of this disclosure is a new form of output filter that includes a coupled inductor as part of the output filter. An example schematic of this new coupled LCLC filter is shown in FIG. 10. FIG. 10 shows the required elements (L1-L3, C1, C3, L2, C2, L4, C4) and the load (RLOAD). The coupled inductor is designed to have a relatively large leakage inductance. Leakage inductance is defined as the residual inductance measured in the winding of a transformer (or coupled inductor) when the unmeasured winding is shorted. When a winding is shorted the magnetizing inductance associated with two windings is eliminated and the remaining inductance is series connection of the leakage inductances in both windings. In case of symmetrical design for both windings, the leakage inductances are close in value, and can be found by measurement by dividing the measured total leakage by two. This leakage inductance acts in place of the separate inductors L1 and L3 shown in FIG. 9, in fact, insuring the same inductance values would insure the same frequency response of the system: with separate or magnetically coupled inductors. In addition to the leakage inductance of the coupled inductor a portion of the signal from one winding is coupled to the other winding.

Figure 11:
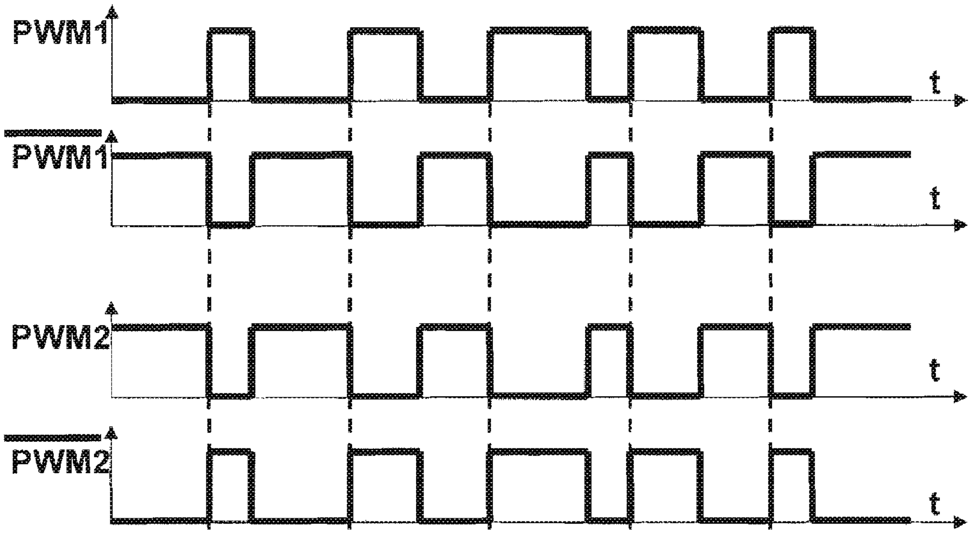
FIG. 11 is a chart showing PWM signals for a dual channel D class amplifier with differential outputs in which the switching periods for all the signals are aligned.
Figure 12:
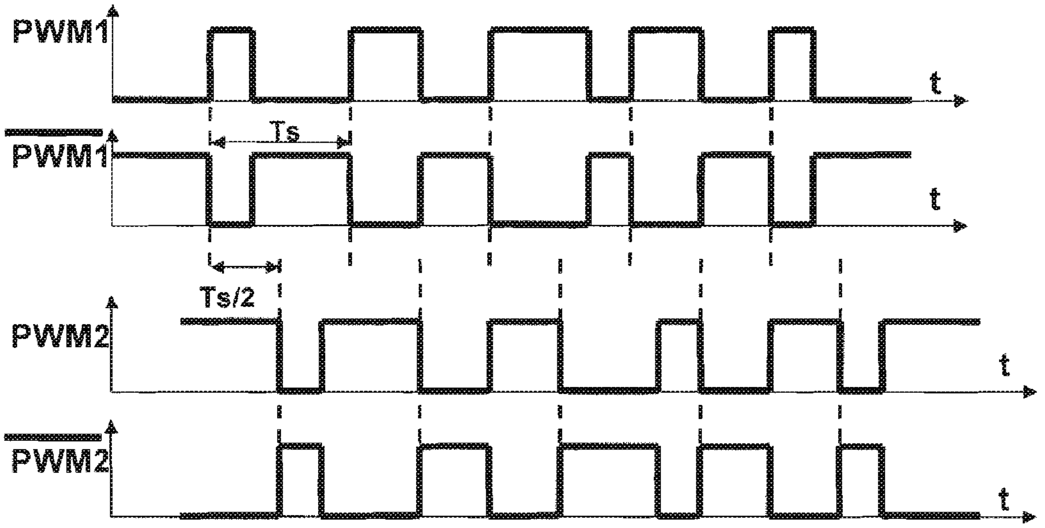
FIG. 12 is a chart showing PWM signals for a dual channel D class amplifier with differential outputs in which a phase shift is inserted between PWM signals for the two channels.

To take advantage of the coupled inductor, a second change is made to the system. The class D or E amplifier from FIG. 8 is often dual channel amplifier, delivering differential output to the load. As typically the same signal is amplified for a single output, one PWM modulator is used to derive pulses for the both amplifier channels, insuring such connection that output of one channel increases voltage, when another channel decrease the output voltage, and vise-versa. This is a common scheme for providing a differential output for such amplifiers. It is also simple to use the same PWM signal and its inverted signal to drive switching devices in both channels of the amplifier, as for example illustrated in FIG. 11 the switching periods for all the signals are aligned. The proposed scheme, on the other hand, inserts a phase shift between PWM signals for the two channels, as shown in FIG. 12. The proposed phase shift between periodic signals is 180 degrees, or half the period. Phase shift between the signals is shown as Ts/2, half of the switching period Ts.

Figure 13:
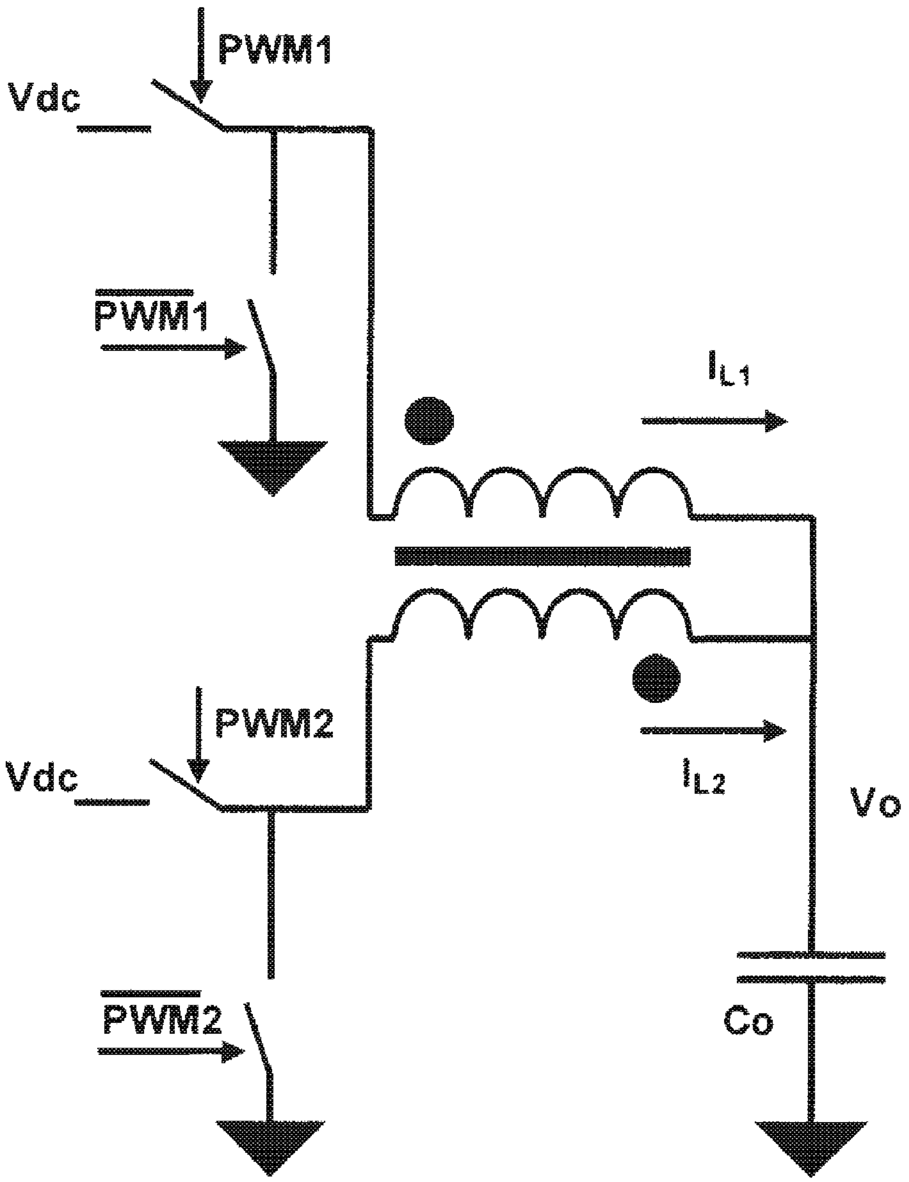
FIG. 13 (PRIOR ART)
FIG. 13 is a schematic diagram showing a multiphase buck converter with coupled inductors.

The described phase shift between two or more channels can be found in prior art, for example in multiphase buck converter applications, or in U.S. Pat. No. 6,362,986 to Shultz et al., entitled “Voltage converter with coupled inductive windings, and associated methods.” U.S. Pat. No. 6,362,986 represents closer prior art, as it has phase shift together with magnetic coupling between inductors, as illustrated in FIG. 13, where only two phases of multiphase buck converter are shown. This proposed arrangement is shown in FIG. 14, so the differences from prior art in FIG. 13 are illustrated clearly.

Figure 14:
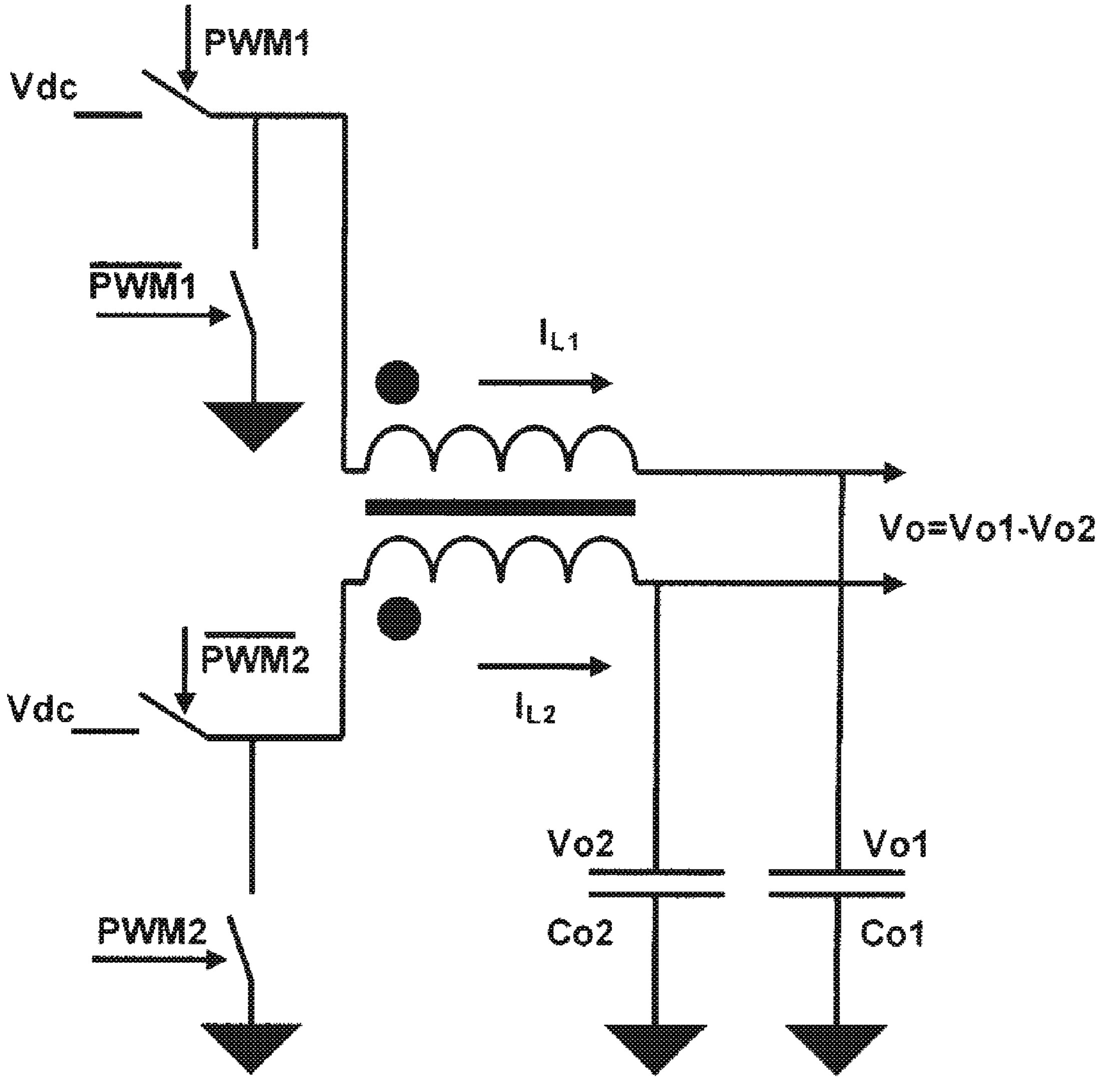
FIG. 14 is a schematic diagram showing a differential amplifier output stage with coupled inductors.

Notice that the output voltage of circuit in FIG. 14 is differential, while in FIG. 13 it is not. With zero input signal for the amplifier, the duty cycle of both PWM1 and PWM2 in FIG. 14 is 0.5, so Vo1=Vo2=Vdc/2. This relates to zero differential output voltage. When input signal is applied to modulators, if Vo1 rises to positive rail Vdc from Vdc/2—then Vo2 is dropping towards zero from the same Vdc/2. The currents in inductors in FIG. 14 are also opposite, as compared to added currents in FIG. 13. If current IL1 is positive (sourcing), then the current IL2 is negative (sinking). Notice also that the average values of the IL1 and IL2 are absolutely equal, as these outputs are effectively shorted to each other through the load in series. The magnetic coupling of proposed arrangement in FIG. 14 is also in phase, relatively to the pins connected to the outputs of the amplifier channels or phases. The prior art arrangement in FIG. 13 uses inverse magnetic coupling, relatively to the outputs of the buck converter stages. The load in FIG. 13 is typically connected from the common connection of all inductors to the ground or return, while the load for circuit in FIG. 14 should be connected between two differential outputs.

Magnetic coupling between windings in FIG. 14 effectively doubles the frequency of the current ripple in each winding because when one winding or channel switches it induces a current ripple in the opposite winding even though that winding did not switch yet (due to the phase shift).

Figure 15:
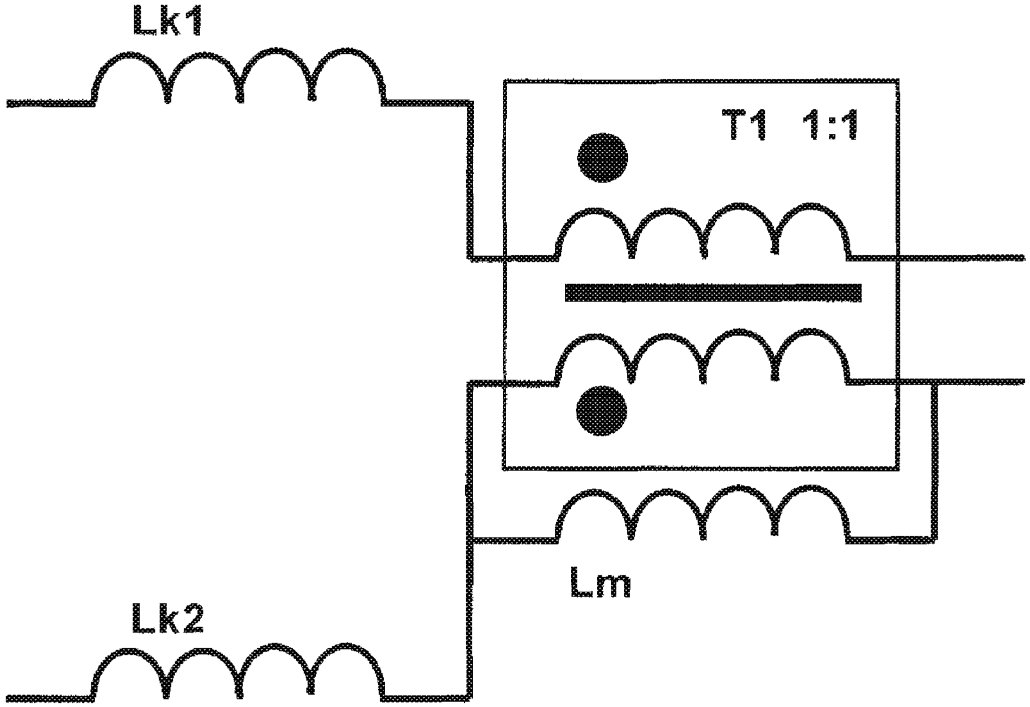
FIG. 15 is schematic diagram showing a simplified general model of the coupled inductor of FIG. 14.

The coupled inductor from FIG. 14 can be modeled as ideal transformer T1 in FIG. 15, with ideal magnetic coupling, with added magnetizing inductance Lm and leakages in each winding Lk1 and Lk2. These leakage inductances could be also made external, for example, standard transformer with good magnetic coupling and negligible leakage could be used with external separate inductance added in series with each winding. The general coupled inductor model for arrangement in FIG. 14 is shown in FIG. 15, where Lk1 and Lk2 can be leakage inductances of the common structure, or dedicated external inductors.

Figure 16:
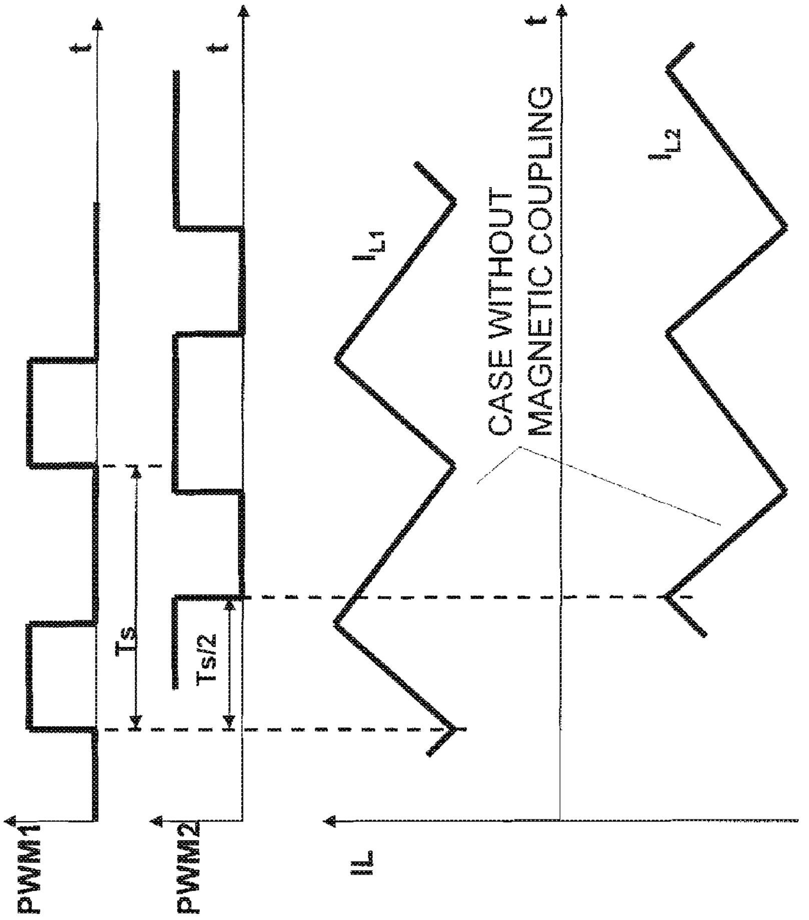
FIG. 16 is a chart showing waveforms for FIG. 14 when inductors are not magnetically coupled.
Figure 17:
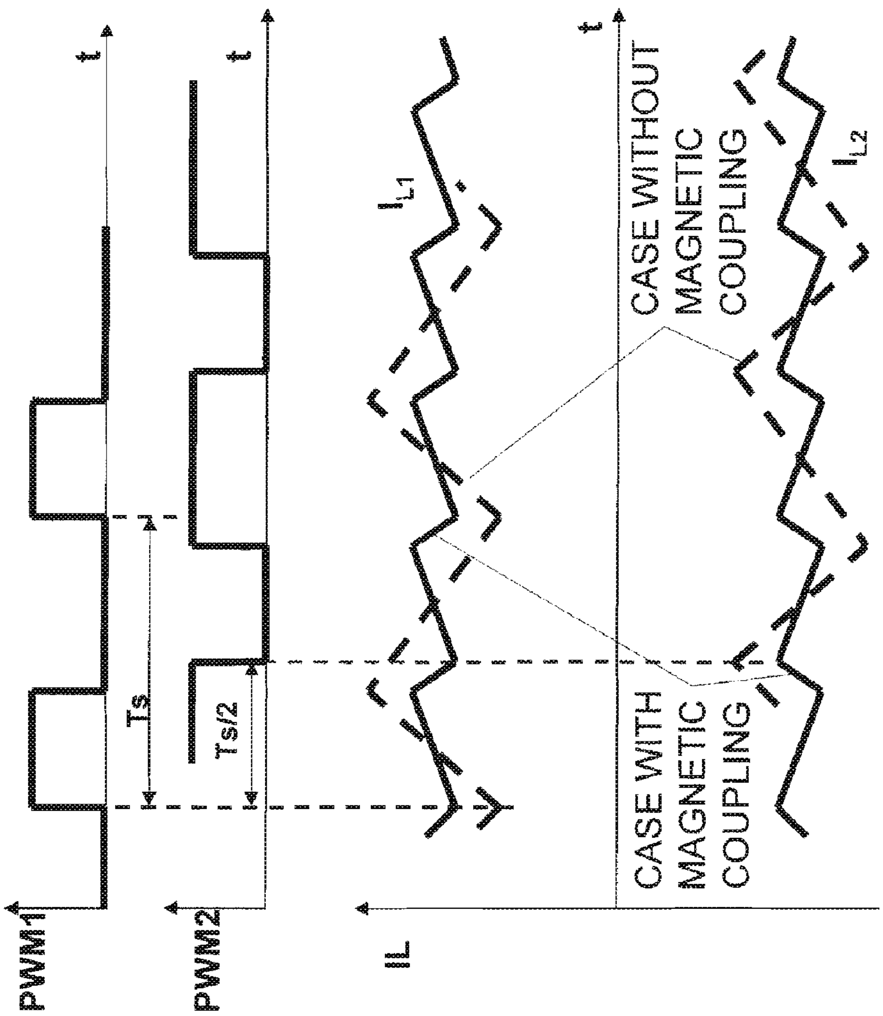
FIG. 17 is a chart showing waveforms for FIG. 14 when inductors are magnetically coupled, the solid lines for inductor current corresponding to inductors magnetically coupled and broken lines for inductor current corresponding to inductors without magnetic coupling.
Figure 18:
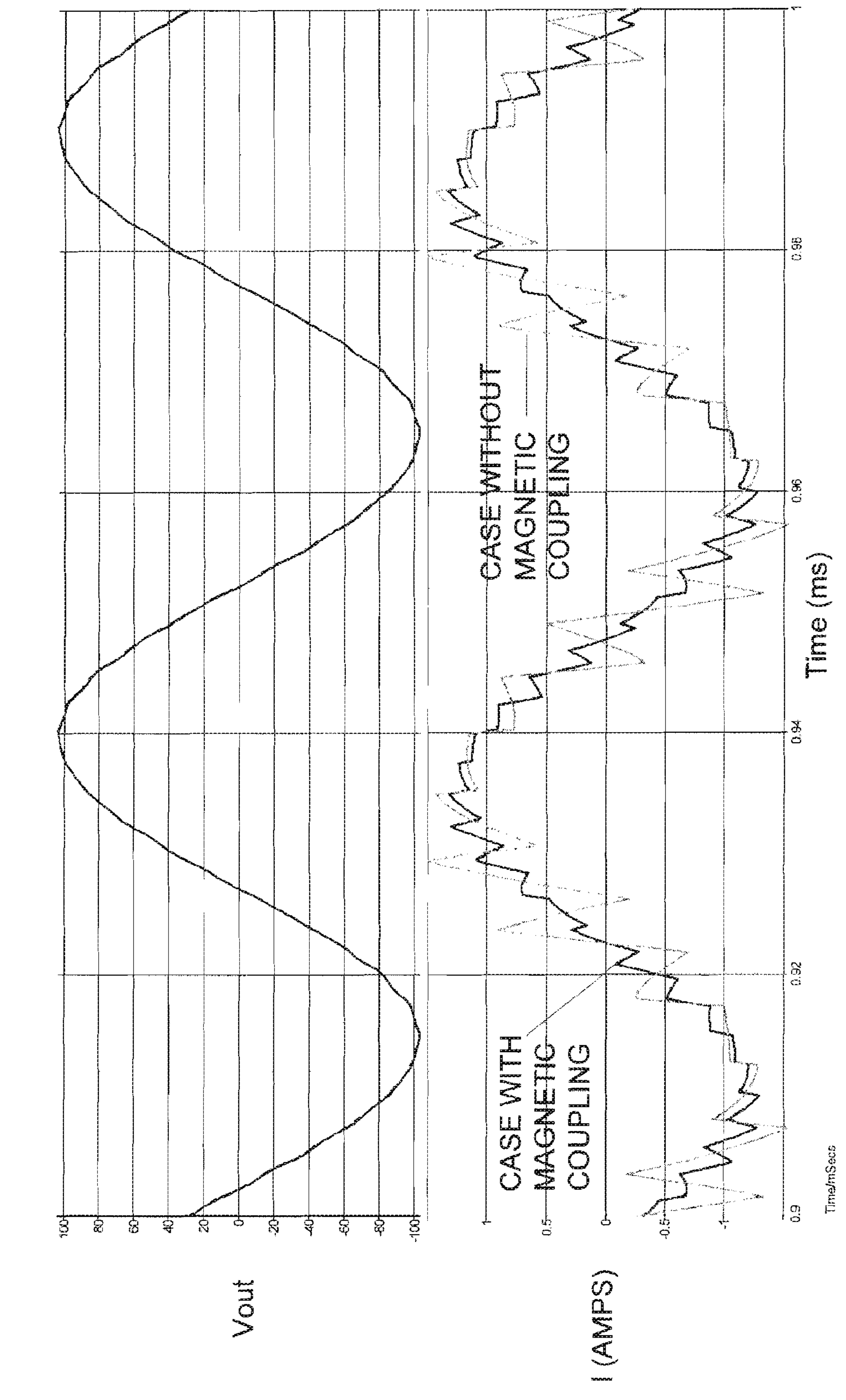
FIG. 18 is a chart showing waveforms for a 20 kHz output signal with 90 uH/94 nF filters with added 180 phase shift in a second oscillator, Vdc=100 V, Rload=100, the solid lines for inductor current corresponding to inductors magnetically coupled and broken lines for inductor current corresponding to inductors without magnetic coupling.

Waveforms for the circuit in FIG. 14 with no magnetic coupling between inductors is shown in FIG. 16. Inductors work as energy storage components, ramping current up and down under applied voltage across the related inductor. Applied voltage changes only due to the switching of the related power circuit, where the inductor is connected. FIG. 17 shows the same waveforms but when inductors in FIG. 14 are magnetically coupled. Due to magnetic coupling, applied voltage across the leakage inductances is changed not only due to the switching of the related power circuit, where the inductor is connected, but also when another power circuit switches. This effectively doubles the frequency of the current ripple in each coupled inductor, for the illustrated case where two inductors are magnetically coupled, and the phase shift between two driving signals is 180 degrees. This coupling effect leads to the decrease of the current ripple amplitude in the each inductor. FIG. 18 illustrates the decrease of the current ripple in inductor for particular example. Sine wave signal of the 20 KHz frequency is delivered at the differential output of the amplifier, where two channels have a phase shift for the switching signals of 200 KHz main PWM frequency. The bottom traces show inductor current without and with magnetic coupling, clearly indicating the current ripple decrease.

The decreased current ripple offers several benefits to the circuit and its performance. Decreased current ripple makes it easier for the output filter to achieve low noise levels and low output voltage ripple at the output, in other words—either smaller attenuation could be used as compared to the case without magnetic coupling, or lower noise level can be achieved. Decreased amplitude of the current ripple also means that the RMS value of the current waveform is lower, which relates to lower conduction losses. Lower current ripple also implies lower peaks of the current, which relates to the lower stress in switching devices of the power circuits. As the DC component of the load current is the same in both coupled inductors (the outputs are connected to each other through the load so the load current is equal), and since these currents create opposite magnetic flux for arrangement shown in FIG. 14—cancellation of the DC component of the magnetic flux in the core is beneficial for the small core size and low core losses. The decrease of the current ripple is generally good for EMI decrease, and makes it easier to pass regulatory requirements. While the performance of the filter in terms of the amplifier signals is dependent on the leakage inductance values, the noise signals of the Common Mode (same in both output nets) will be attenuated by much larger magnetizing inductance. In this regard, Common Mode noise, often being present in circuits and representing a need for additional high frequency filtering for the output connections, will be attenuated at much higher degree in magnetically coupled inductor arrangement in FIG. 14, as compared to the same arrangement but without magnetic coupling.

Figure 19:
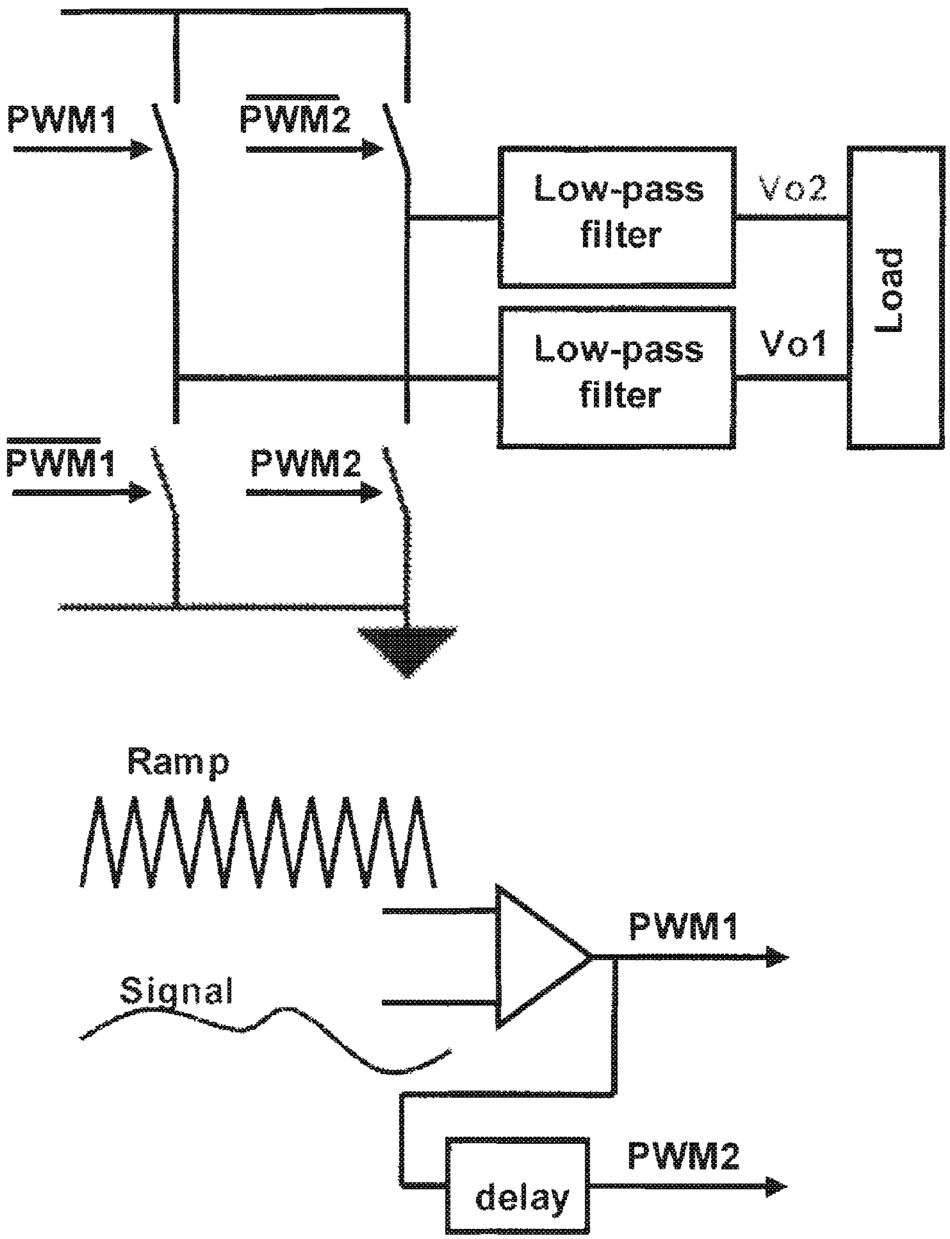
FIG. 19 is a diagram showing a D class amplifier with differential outputs in which a first PWM output signal is delayed to generate a second PWM output signal.

The phase shifted PWM2 signal for the second differential amplifier circuit in FIG. 12 can be created with a second PWM modulator, where the ramp for the second modulator is phase shifted from the ramp for the first one. However, the cheaper and simpler alternative is also proposed, which also improves the noise immunity and insures reliable current ripple cancellation, is to use one PWM modulator, and just delay that signal by half the switching period to achieve 180 degrees phase shift for the second channel signals, as shown in FIG. 19. As the modulator frequency is typically much higher than the maximum frequency of the amplified signal, the introduced signal distortion can be minimized.

The magnetic components from FIG. 14 could be arranged in a single structure with two windings. Such structure could be called a transformer with purposely large leakage or decreased coupling.

Figure 20:
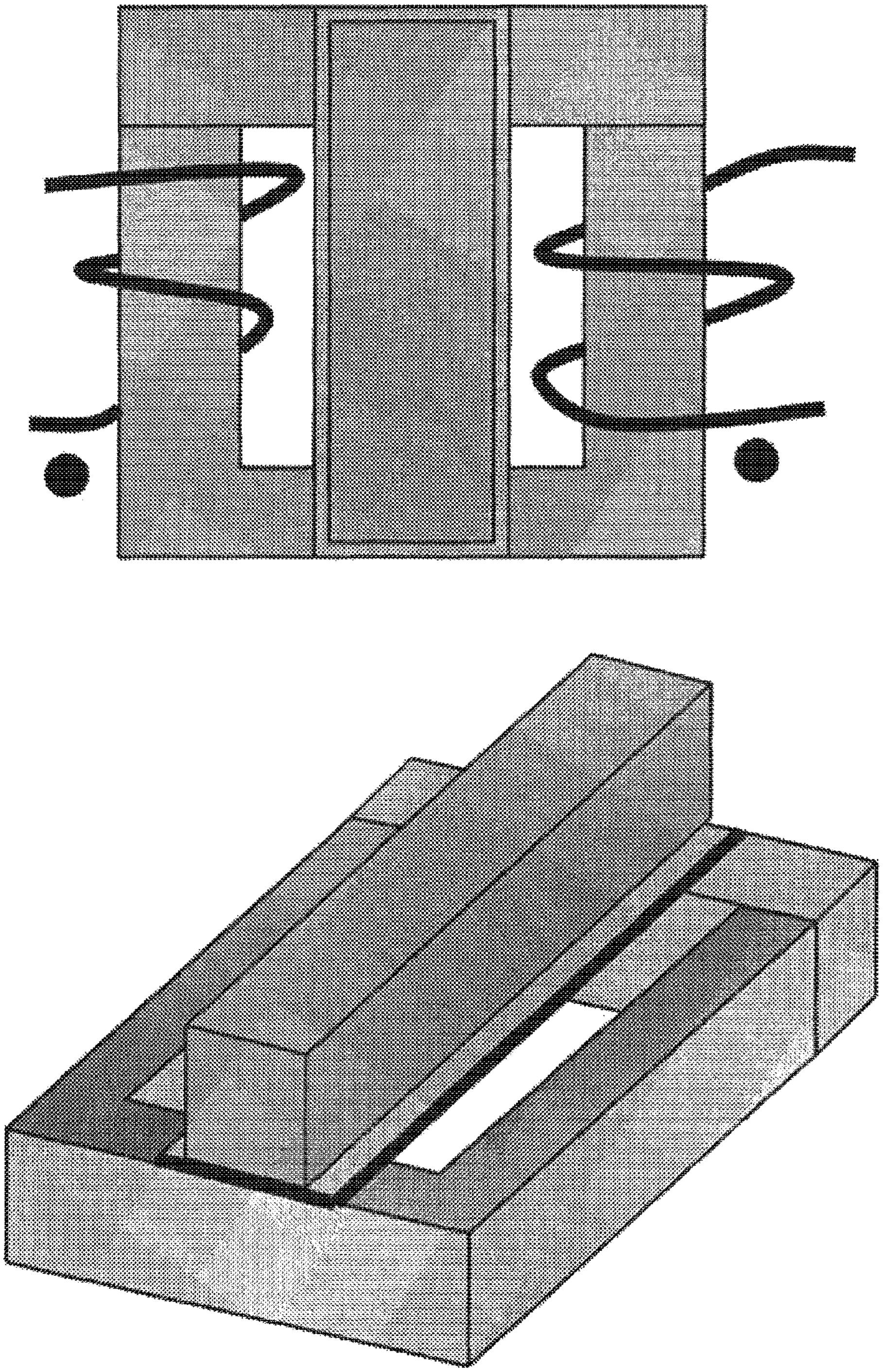
FIGS. 20-22 show simplified diagrams showing varying arrangements for a transformer with leakage, the transformer corresponding to magnetically coupled inductors in an output filter.
Figure 21:
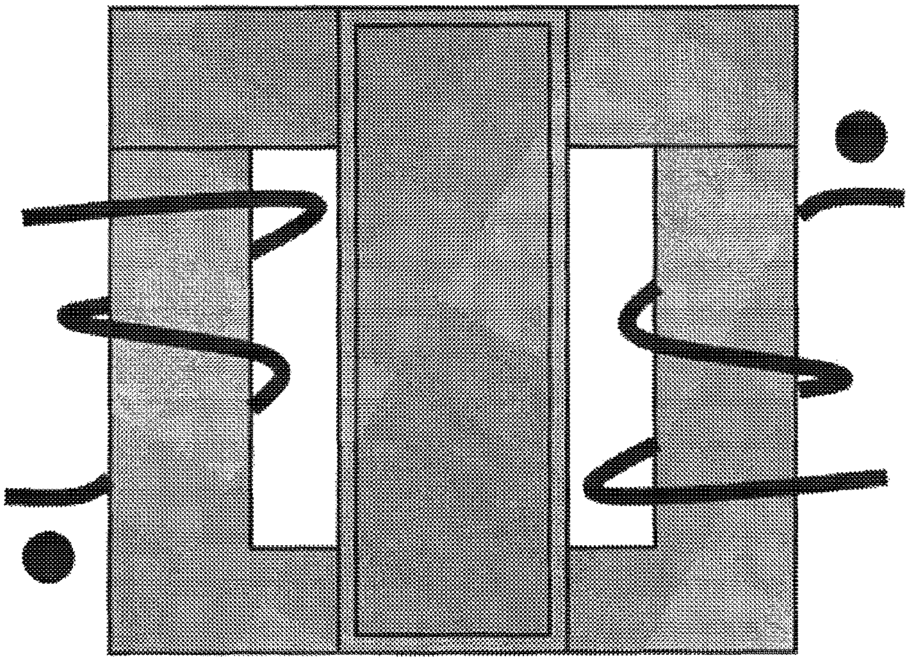
Figure 22:
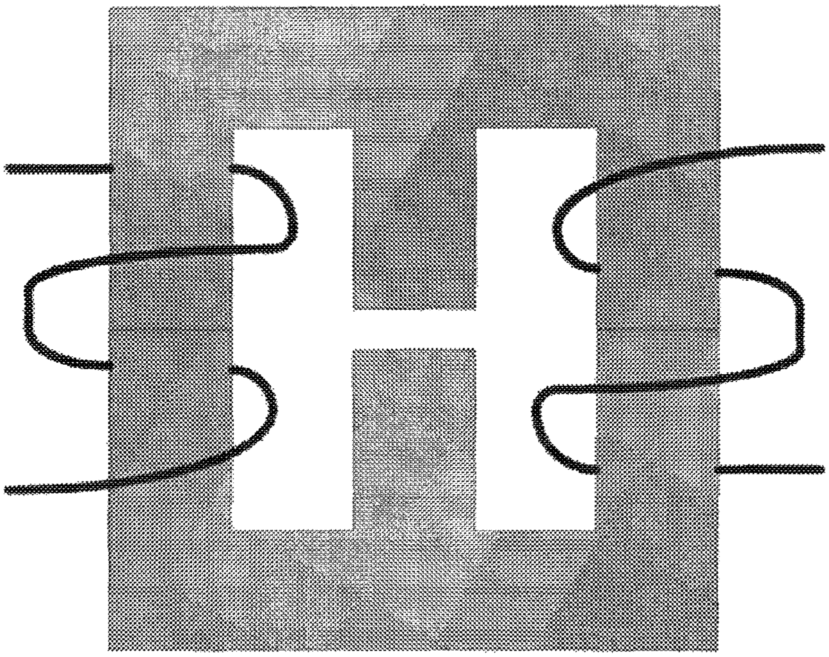

FIG. 20 shows one possible implementation for transformer with leakage. This structure will create have leakage via air paths, but the value would be difficult to control accurately in a manufacturing environment. FIG. 21 and FIG. 22 show additional arrangements for transformer with leakage. FIG. 22 allows the best control of the leakage (gap value—spacer thickness).

The above described transducer can be a part of or contained in any type of apparatus, including without limitation a surgical device, a cutting tool, a fragmentation tool, an ablation tool, and an ultrasound imaging device.

Figure 23:
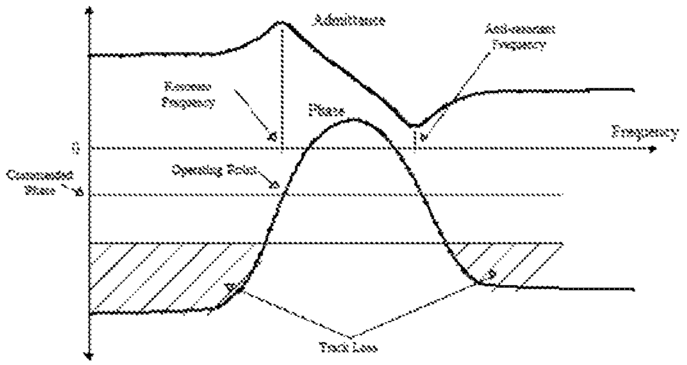
FIG. 23 illustrates graphically the concepts of phase and admittance of a typical ultrasonic transducer, as functions of frequency, in accordance with the principles and teachings of the disclosure.

Referring now to FIG. 23, phase and admittance of a typical ultrasonic transducer, as functions of frequency, are illustrated graphically. Maximum admittance (minimum impedance) occurs at the resonant frequency of the transducer, while minimum admittance (maximum impedance) occurs at the anti-resonant frequency.

The method described assumes the operating point is defined to be at or near the resonant frequency, where admittance is maximum. However, the same approach may be used, with appropriate sign reversals, for operation at the anti-resonant frequency, where admittance is minimum.

Figure 24:
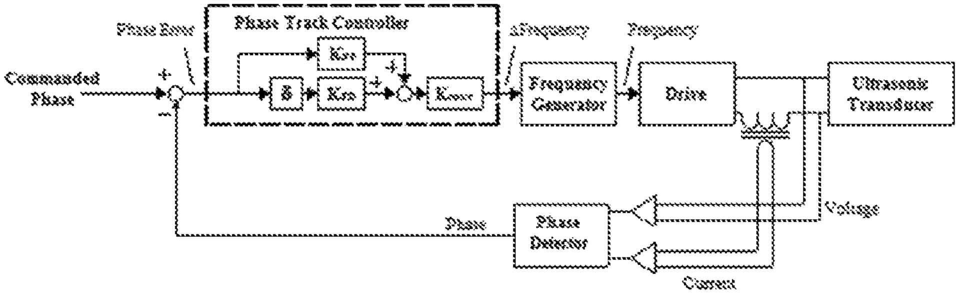
FIG. 24 illustrates a phase track controller as a means of controlling the frequency to maintain phase in accordance with the principles and teachings of the disclosure.

FIG. 24 illustrates a linear phase track controller as a way of controlling the frequency to maintain phase, as described herein. A commanded phase, selected to be well below the anticipated minimum peak phase and to be near the resonant frequency of the transducer is specified as the operating point. The measured phase of the system, defined as the phase angle between the transducer voltage and transducer current, is fed back and instantaneously subtracted from the commanded phase to form the phase error. In response to a positive phase error (the measured phase is less than the commanded phase), the linear phase track controller generates a positive frequency step (ΔFrequency), increasing the drive frequency and thereby decreasing the phase error.

Similarly, in response to a negative phase error (the measured phase is greater than the commanded phase), the linear phase track controller generates a negative ΔFrequency, decreasing the drive frequency and thereby again decreasing the phase error.

If the phase error becomes too great, phase tracking can be lost. Loss of phase tracking (also called loss of lock) can occur when the controller is used in systems with significant phase noise. In addition, as the physical load on the transducer changes, the phase response (and the admittance response also) can shift in frequency, become wider or narrower, and/or can have a greater or lesser peak value. If this physical load change occurs rapidly with respect to the system sampling interval, measured phase can transition to the high frequency (or anti-resonance) side of the transducer phase curve, also ultimately resulting in loss of lock.

The following describes a method that anticipates loss of lock and corrects for it prior to its occurrence.

Figure 25:
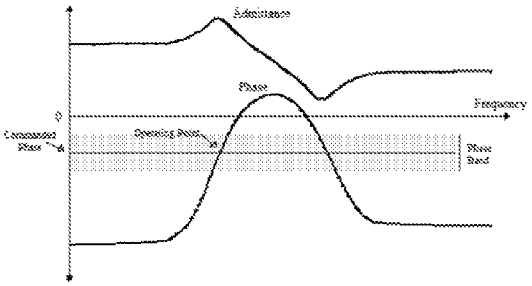
FIG. 25 illustrates the phase response curve with phase operating regions defined in accordance with the principles and teachings of the disclosure.

FIG. 25 illustrates the phase response curve with phase operating regions defined. As long as the sensed phase remains within the phase band (i.e., near the operating point), the linear phase track controller executes. However, if phase is sensed to be outside the phase band, linear phase track control may be conditionally suspended and one of two mechanisms, an "Up Search" or a "Down Search," may be executed to drive the phase back into the desired phase band.

Figure 26:
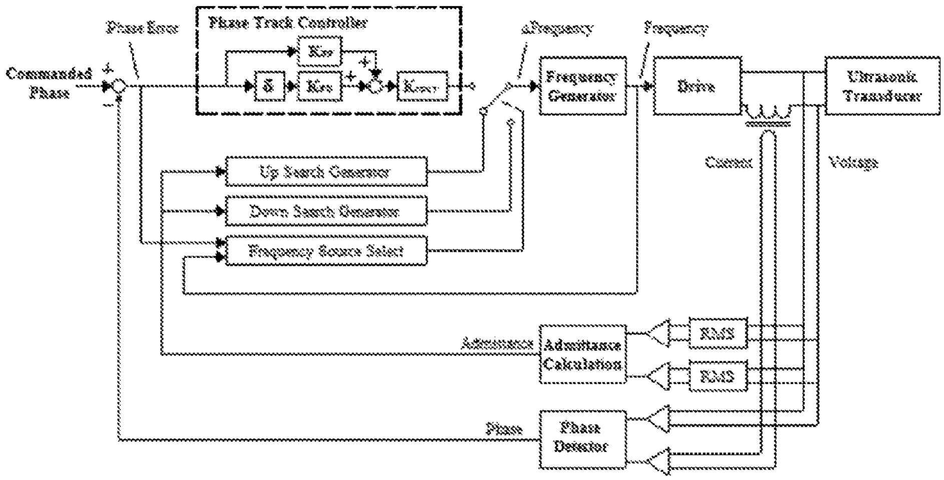
FIG. 26 illustrates an enhancement to the phase track control mechanism in accordance with the principles and teachings of the disclosure.

FIG. 26 illustrates an enhancement to the phase track control mechanism in accordance the teachings of this disclosure. The frequency source select module determines the source of the frequency step, ΔFrequency, applied to the Frequency Generator, switching among: 1) the Linear Phase Track Controller; 2) the Up Search Generator; and/or 3) the Down Search Generator.

When the sensed and measured phase is within the specified phase band, the frequency source select selects the linear phase track controller for generating frequency steps (ΔFrequency) either increasing or decreasing.

If the sensed phase is greater than the upper edge of the phase band and the frequency is increasing, the frequency source select selects the down search generator, which is activated. The down search generator generates a pre-defined number of negative ΔFrequency steps, while also looking for a maximum admittance (or, alternatively, a minimum phase error). After completion of the pre-defined number of steps, the frequency is set to the frequency of the sensed maximum admittance (or the frequency of the minimum phase error) and frequency source select re-selects the linear phase track controller as the source of the frequency stepping.

If the measured phase is greater than the upper edge of the phase band and the frequency is decreasing, the frequency source select continues to select the linear phase track controller as the source of the frequency stepping.

In an implementation, if the sensed phase is less than the lower edge of the phase band and the frequency is decreasing, the frequency source select selects the up search generator, which is activated. The up search generator generates a pre-defined number of positive ΔFrequency steps, while also looking for a maximum admittance (or, alternatively, a minimum phase error). After completion of the pre-defined number of steps, the frequency is set to the frequency of the sensed maximum admittance (or the frequency of the minimum phase error) and the frequency source select re-selects the linear phase track controller as the source of the frequency stepping.

In an implementation, if the measured phase is less than the lower edge of the phase band and the frequency is increasing, the frequency source select continues to select the linear phase track controller as the source of the frequency stepping.

In an implementation, if the measured phase falls below the loss of lock threshold, loss of lock has occurred and methods outside the scope of this description must be implemented to regain phase lock.

Figure 27:
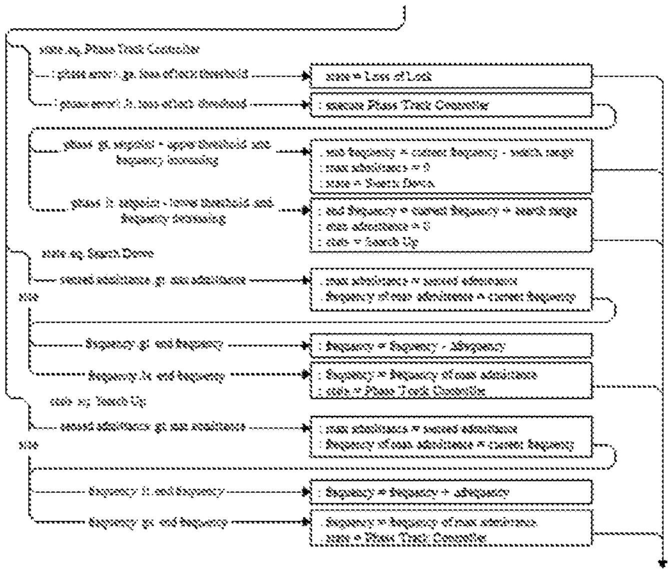
FIG. 27 illustrates a state diagram of an implementation of the Up Search and Down Search Generators and the Frequency Source Select components.

FIG. 27 illustrates the state diagram of the implementation of the up search and down search generators and the frequency source select components as described herein above. This logic is executed periodically, nominally at 1 to 100 millisecond intervals.

In an implementation, frequency steps may change linearly, exponentially, and logarithmically.

In an implementation, it may be determined that phase is corrected when it deviates more than 30 degrees out of phase and that ten (10) steps of up and down searching will be performed, wherein each step is 5 Hz. However, it will be appreciated that any phase deviation, step size and number of steps may be used as desired.

The foregoing description has been presented for the purposes of illustration and description. It is not intended to be exhaustive or to limit the disclosure to the precise form disclosed. Many modifications and variations are possible in light of the above teaching. Further, it should be noted that any or all of the aforementioned alternate implementations may be used in any combination desired to form additional hybrid implementations of the disclosure.

Further, although specific implementations of the disclosure have been described and illustrated, the disclosure is not to be limited to the specific forms or arrangements of parts so described and illustrated. The scope of the disclosure is to be defined by the claims, if any, any future claims submitted here and in different applications, and their equivalents.

What is claimed is:

1. A method for anticipating phase lock in a resonant system operating under a track control protocol comprising:

selecting a phase track controller for a drive circuit with a frequency source selector for driving the track control protocol;

wherein the frequency source selector also selects an increasing frequency step generator or a decreasing frequency step generator a source of frequency stepping;

establishing a phase error threshold for a resonant drive circuit being driven at a predetermined operating point;

establishing a step increment for phase correction that corresponds to the resonant drive circuit;

establishing a number of steps for the step increment for phase error correction once a measured phase falls outside of a predetermined phase range bounded by a lower edge of the phase band and an upper edge of the phase band;

sensing a phase error trend in the phase locked system;

suspending the track control protocol for the resonant drive circuit with the frequency source selector;

applying the established number steps of the step increment for phase correction via the selected frequency step generator; and sensing phase error correction and reestablishing track control by reinstating the track control protocol.

2. The method of claim 1, wherein the phase track controller is retained as the source of the frequency stepping if the measured phase is within the phase band.

3. The method of claim 1, wherein the phase track controller is retained as the source of the frequency stepping if the measured phase becomes greater than the upper edge of the phase band and the frequency is decreasing.

4. The method of claim 1, wherein the phase track controller is retained as the source of the frequency stepping if the measured phase becomes less than the lower edge of the phase band and the frequency is increasing.

5. The method of claim 1, wherein the phase track controller is suspended and the increasing frequency step generator serves as the source of the frequency stepping if the measured phase is less than the lower edge of the phase band and the frequency is decreasing.

6. The method of claim 1, wherein the increasing frequency step generator is suspended as the source and the phase track controller selected as the source of the frequency stepping when the increasing frequency step generator has executed the predetermined number of steps.

7. The method of claim 6, further comprising setting an initial frequency of the phase track controller to a frequency of zero phase;

wherein the frequency of minimum phase error was sensed while the increasing frequency step generator was active.

8. The method of claim 6, further comprising setting he initial frequency of the phase track controller to a frequency of maximum admittance when the increasing frequency step generator is suspended and the phase track controller becomes the source of the frequency stepping;

wherein the frequency of maximum admittance was sensed while the increasing frequency step generator was active.

9. The method of claim 1, wherein the phase track controller is suspended and the decreasing frequency step generator serves as the source of the frequency stepping if the measured phase is greater than the upper edge of the phase band and the frequency is increasing.

10. The method of claim 1, wherein the decreasing frequency step generator is suspended and the phase track controller is selected as the source of the frequency stepping when the decreasing frequency step generator has executed the predetermined number of steps.

11. The method of claim 10, further comprising setting the initial frequency of the phase track controller to a frequency of zero phase when the decreasing frequency step generator is suspended and the phase track controller becomes the source of the frequency stepping;

wherein the frequency of minimum phase error was sensed while the decreasing frequency step generator was active.

12. The method of claim 10, further comprising setting the initial frequency of the phase track controller to a frequency of maximum admittance when the decreasing frequency step generator is suspended and the phase track controller becomes the source of the frequency stepping;

wherein the frequency of maximum admittance was sensed while the decreasing frequency step generator was active.

13. The method of claim 1, wherein the operating point is substantially near a resonant frequency where admittance is at a maximum.

14. The method of claim 1, wherein the step increment is linear between steps.

15. The method of claim 1, wherein the step increment is logarithmic between steps.

16. The method of claim 1, wherein the step increment is exponential between steps.

17. The method of claim 1, wherein the step increment is determined by characteristics of the drive circuits.

18. The method of claim 1, wherein the phase range is determined by characteristics of the drive circuits.

19. The method of claim 1, wherein the number of step increments is determined by characteristics of the drive circuits.

20. The method of claim 1, suspending the phase track control prior to loss of lock.

21. The method of claim 1, further comprising repeating the sensing periodically at 1 to 100 millisecond intervals.

22. The method of claim 1, further comprising generating a positive step increment in response to a measured phase that is less than a commanded phase.

23. The method of claim 1, wherein the phase track controller generates a positive frequency step thereby increasing the drive frequency and decreasing the phase error.

24. The method of claim 1, further comprising generating a negative frequency step in response to a negative sensed phase that is greater than a commanded phase.

25. The method of claim 1, wherein the phase track controller generates a negative frequency step thereby decreasing the drive frequency.

26. A method for anticipating phase lock in a resonant system operating under a track control protocol comprising:

driving a phase lock controller to drive a circuit with a frequency source selector;

establishing a phase error threshold for a resonant drive circuit being driven at a predetermined operating point;

establishing a step increment for phase correction that corresponds to the resonant drive circuit;

establishing a number of steps for the step increment for phase error correction once a measured phase falls outside of a predetermined phase range bounded by a lower edge of the phase band and an upper edge of the phase band;

sensing a phase error trend in the phase locked system;

suspending the track control protocol for the resonant drive circuit with the frequency source selector;

selecting with a frequency source selector an increasing frequency step generator if the measured phase is less than the lower edge of the phase band and the frequency is decreasing;

generating increasing frequency steps with an increasing frequency step generator;

driving the circuit with the increased frequency steps in correspondence with the established number steps of the increased step increment for phase correction via the selected frequency step generator;

sensing phase error correction and suspending the increasing frequency step generator; and reestablishing track control via the frequency source selector to the track control protocol.

27. A method for anticipating phase lock in a resonant system operating under a track control protocol comprising:

driving a phase lock controller to drive a circuit with a frequency source selector;

establishing a phase error threshold for a resonant drive circuit being driven at a predetermined operating point;

establishing a step increment for phase correction that corresponds to the resonant drive circuit;

establishing a number of steps for the step increment for phase error correction once a measured phase falls outside of a predetermined phase range bounded by a lower edge of the phase band and an upper edge of the phase band;

sensing a phase error trend in the phase locked system;

suspending the track control protocol for the resonant drive circuit with the frequency source selector;

selecting with a frequency source selector a decreasing frequency step generator if the measured phase is greater than the upper edge of the phase band and the frequency is increasing;

generating decreasing frequency steps with an decreasing frequency step generator;

driving the circuit with the decreased frequency steps in correspondence with the established number steps of the decreased step increment for phase correction via the selected frequency step generator;

sensing phase error correction and suspending the decreasing frequency step generator; and reestablishing track control via the frequency source selector to the track control protocol.

* * * * *